(12) United States Patent
Furtek et al.

(10) Patent No.: US 6,292,021 B1
(45) Date of Patent: Sep. 18, 2001

(54) FPGA STRUCTURE HAVING MAIN, COLUMN AND SECTOR RESET LINES

(75) Inventors: Frederick C. Furtek, Menlo Park; Martin T. Mason, San Jose, both of CA (US); Robert B. Luking, Catonsville, MD (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 09/650,979

(22) Filed: Aug. 29, 2000

Related U.S. Application Data

(62) Division of application No. 09/078,409, filed on May 13, 1998, which is a division of application No. 08/650,477, filed on May 20, 1996, now Pat. No. 5,894,565.

(51) Int. Cl.$^7$ .............................................. H03K 19/177
(52) U.S. Cl. ................... 326/41; 326/38; 326/93
(58) Field of Search ................... 326/37–41, 93

(56) References Cited

U.S. PATENT DOCUMENTS

| Re. 34,363 | 8/1993 | Freeman | 307/465 |
|---|---|---|---|
| 4,700,187 | 10/1987 | Furtek | 340/825.83 |

(List continued on next page.)

OTHER PUBLICATIONS

Atmel, *Field Programmable Gate Arrays, AT6000 Series*, pp. 1–20.
Altera, *FLEX 8000 Programmable Logic Device Family*, Data Sheet, Mar. 1996, ver. 6, pp. 37–56.
Altera, *FLEX 10K Embedded Programmble Logic Family*, Data Sheet, Jul. 1995, ver. 1, pp. 1–54.
Xilinx, *XC4000 Series Field Programmable Gate Arrays*, Advanced Product Information, Feb. 2, 1996, (Version 0.91), pp. 1–112.
Xilinx, *XC5200 Logic Cell Array Family*, Preliminary Product Description, Oct. 1995 (Version 3.0), pp. 1–30.
Xilinx, *A Technical Overview For the First–Timer User*, FPGA Product Description and Specifications, pp. 2–1 to 2–103.

(List continued on next page.)

*Primary Examiner*—Michael Tokar
*Assistant Examiner*—Don Phu Le
(74) *Attorney, Agent, or Firm*—Thomas Schneck; Mark Protsik

(57) ABSTRACT

A field programmable gate array with a matrix of rows and columns of programmable logic cells interconnectable to each other by a network of local and express bus lines and to I/O pads at the perimeter of the logic cell matrix and bus network, is characterized by having a set of reset lines which include main reset lines, column reset lines, and sector reset lines. Each of the main reset lines receives a different reset signal. Each of the column reset lines is associated with a particular column of logic cells of the matrix. Each column reset line is selectively connectable to any one of the main reset lines to receive a selected reset signal. Each of the sector reset lines is connected to a subset of the logic cells in a column. The column reset lines are selective connectable to the logic cells in this respective associated columns by means of the sector reset lines that are connectable to the column reset lines.

3 Claims, 20 Drawing Sheets

U.S. PATENT DOCUMENTS

| | | | |
|---|---|---|---|
| 4,706,216 | 11/1987 | Carter | 365/94 |
| 4,758,985 | 7/1988 | Carter | 365/94 |
| 4,873,459 | 10/1989 | El Gamal et al. | 307/465 |
| 4,918,440 | 4/1990 | Furtek | 340/825.83 |
| 4,935,734 | 6/1990 | Austin | 340/825.83 |
| 5,019,736 | 5/1991 | Furtek | 307/465 |
| 5,144,166 | 9/1992 | Camarota et al. | 307/465.1 |
| 5,185,706 | 2/1993 | Agrawal et al. | 364/489 |
| 5,204,556 | 4/1993 | Shankar | 307/465.1 |
| 5,224,056 | 6/1993 | Chene et al. | 364/490 |
| 5,231,588 | 7/1993 | Agrawal et al. | 364/489 |
| 5,253,363 | 10/1993 | Hyman | 395/800 |
| 5,254,886 | 10/1993 | El-Ayat et al. | 307/465 |
| 5,258,668 | 11/1993 | Cliff et al. | 307/465 |
| 5,260,610 | 11/1993 | Pedersen et al. | 307/465 |
| 5,260,881 | 11/1993 | Agrawal et al. | 364/489 |
| 5,295,090 | 3/1994 | Hsieh et al. | 364/784 |
| 5,296,759 | 3/1994 | Sutherland et al. | 307/465.1 |
| 5,302,865 | 4/1994 | Steele et al. | 307/465 |
| 5,311,080 | 5/1994 | Britton et al. | 307/465 |
| 5,313,119 | 5/1994 | Cooke et al. | 307/465.1 |
| 5,317,698 | 5/1994 | Chan | 395/325 |
| 5,336,950 | 8/1994 | Popli et al. | 307/465 |
| 5,343,406 | 8/1994 | Freeman et al. | 364/490 |
| 5,349,250 | 9/1994 | New | 307/465 |
| 5,352,940 | 10/1994 | Watson | 307/465 |
| 5,359,536 | 10/1994 | Agrawal et al. | 364/489 |
| 5,365,125 | 11/1994 | Goetting et al. | 326/39 |
| 5,377,123 | 12/1994 | Hyman | 364/489 |
| 5,386,154 | 1/1995 | Goetting et al. | 326/44 |
| 5,386,156 | 1/1995 | Britton et al. | 326/37 |
| 5,408,434 | 4/1995 | Stansfield | 365/189.08 |
| 5,414,377 | 5/1995 | Freidin | 326/41 |
| 5,424,589 | 6/1995 | Dobbelaere et al. | 326/41 |
| 5,425,036 | 6/1995 | Liu et al. | 371/23 |
| 5,426,379 | 6/1995 | Trimberger | 326/39 |
| 5,432,719 | 7/1995 | Freeman et al. | 364/579 |
| 5,442,306 | 8/1995 | Woo | 326/39 |
| 5,455,525 | 10/1995 | Ho et al. | 326/41 |
| 5,457,409 | 10/1995 | Agrawal et al. | 326/39 |
| 5,537,057 | 7/1996 | Leong et al. | 326/41 |
| 5,598,109 | 1/1997 | Leong et al. | 326/41 |
| 5,671,432 | 9/1997 | Bertolet et al. | 395/800 |

OTHER PUBLICATIONS

Xilinx, *XC3000, XC3000A, XC3000L, XC3100, XC3100A Logic Cell Array Families*, FPGA Product Description and Specifications, pp. 105–195.

Keiichi Kawana et al., "An Efficient Logic Block Interconnect Architecture for User–Programmble Gate Array", *Proceedings of the IEEE 1990 Custom Integrated Circuits Conference*, cat. No. 90CH2860–5, pp. 31.3.1–31.3.4 (May 1990).

FPGA STRUCTURE HAVING MAIN, COLUMN AND SECTOR RESET LINES

CROSS-REFERENCE TO RELATED APPLICATIONS

This is a divisional application of Ser. No. 09/078,409 filed May 13, 1998 which is a divisional application of Ser. No. 08/650,477 filed May 20, 1996, now U.S. Pat. No. 5,894,565, granted Apr. 13, 1999.

TECHNICAL FIELD

The present invention relates to programmable multifunctional digital logic array integrated circuits of the type known as field programmable gate arrays (FPGAs), and in particular to improvements in the structure of the configurable logic cells of such FPGAs, as well as of the direct cell-to-cell connections and of the interconnecting bus network of such FPGAs, designed to improve cell utilization and functionality for carrying out logic functions. The invention also relates to FPGAs that include user-accessible memory elements therein for integrating some memory storage capability for use by the FPGA devices' logic cells.

BACKGROUND ART

Digital logic can be implemented using any of several available integrated circuit architectures, including hardwired application-specific integrated circuits (ASICs), mask or fuse-programmed custom gate arrays (CGAs), programmable array logic (PALs), programmable logic arrays (PLAs) and other programmable logic devices (PLDS) that typically employ nonvolatile EPROM or EEPROM memory cell technology for configuration by the user, and field programmable gate arrays (FPGAs) which generally use SRAM configuration bits that are set during each power-up of the chip. Among these various architectures, those with user programmable, erasable and reprogrammable capability are usually preferred over those with fixed or only one-time programmable functionality. FPGAs are capable of implementing large highly complex logic functions, that need not be converted to two-level sum-of-products form to be programmed into these devices. The SRAM-controlled switches not only permit different functions to be loaded so as to very easily reconfigure a device, but also are optimized for high speed operation.

A wide variety of FPGAs are now available, which differ in the complexity of their component logic cells, as well as in the interconnect resources that are provided. FPGAs are disclosed, for example, in U.S. Pat. Nos. 4,706,216; 4,758,985; 5,019,736; 5,144,166; 5,185,706; 5,231,588; 5,258,688; 5,296,759; 5,343,406; 5,349,250; 5,352,940; 5,408,434; and many others.

A typical FPGA architecture is composed of a two-dimensional array or matrix of configurable logic cells that can be selectively linked together by a programmable interconnect structure made up of both direct connections between neighboring logic cells and a network of bus lines and connecting switches distributed between the rows and columns of cells in the matrix. Around the perimeter of the matrix, a set of input/output pads connect to the bus network, the perimeter logic cells or both, allowing signals to be transmitted into and out of the chip. Each individual logic cell is programmed to carry out a relatively simple logic function. Each logic cell typically includes input and output select logic (MUXes), combinatorial logic, one or more storage elements (flip-flop registers) for synchronous operation, and possibly one or more internal feedback lines for performing sequential logic. The combinatorial logic in the cells of some FPGAs is in the form of fixed-function logic gates, possibly with selectable input configurations. However, a preferred FPGA cell uses look-up table memory (configured SRAM) to provide a wider variety of logic functions. The memory cells of the look-up table store a set of data bits whose values correspond to the truth table for a particular function. A set of input signals presented on the memory's address lines causes the memory to provide a one-bit output that is the value stored at the address designated by those input signals. Hence, the look-up table memory implements a function determined by the stored truth values in the memory. The interconnect structure provides direct connections between each cell and its nearest neighbors in the same row or column of the matrix. U.S. Pat. No. 5,296,759 additionally provides connections in one direction to diagonally adjacent cells. In addition to the direct cell-to-cell connections, a set of "local" bus lines provide connections between the cells and a bussing network. Regularly spaced configurable switches, called repeater units, connect the short local bus segments to longer express busses. The repeaters are normally aligned in rows and columns, thereby partitioning the overall array into blocks of cells. One common arrangement organizes groups of 64 logic cells into 8×8 blocks, each having an associated set of local bus segments. Unlike the local bus segments, the express busses span more than one block of cells across the repeaters allowing signals to be routed between different blocks of cells. The express bus lines access the logic cells only through the local bus segments, reducing signal propagation delays on the express lines.

FPGA designers are continuing to make improvements in an attempt to increase the speed and functional flexibility of the devices. For example, it is a design goal to increase the functional capabilities of the individual logic cells, while at the same time keeping the cells small and simple, which is a principal characteristic of the FPGA architecture. A further area in need of improvement is the overall cell utilization of the circuit. In particular, due to a number of trade-offs and inefficiencies in the bussing network and cell-bus interface, FPGA cells are often used merely as "wire-cells" for routing signals between other cells, providing right angle turns, cross-over connections and signal fanout. Such signal routing is an inefficient use of logic cells. Ideally routing would be provided only by the direct connections and bussing network, while logic cells would be used only for logic. Also, because of the relative simplicity of the functions performed by individual cells, some designs provide cells dedicated to carrying out special functions, such as decoding and fast carry operations. Unfortunately, if the particular function is not needed, that cell is wasted. Cell design itself can contribute to the overall utilization of cells in an array. Preferably, the cells have mirror and rotational symmetry with respect to the functions available to its plural inputs and outputs, reducing the need for signal turning and simplifying the function layout of the array of cells. Finally, in most FPGAs, there is a need for user-accessible random access memory (RAM). Various manufacturers use different approaches to provide this needed on-chip memory. For example, Altera provides RAM on the outer edge of the array, while Actel provides alternating bands of logic cells and RAM. Xilinx allows the look-up table memory within the logic cells to be updated by the user during device operation so as to change the functions provided by those cells.

An object of the present invention is to provide an FPGA with increased logic-cell functionality, improved cell utilization, more efficient signal routing by the bussing network and direct cell-to-cell connections, and integrated user-accessible memory capability in the device.

DISCLOSURE OF THE INVENTION

The object is met by an FPGA matrix in which user-accessible memory structures (or dedicated logic), i.e. both the memory structures and the dedicated logic considered as "dedicated function elements", is provided in the normally empty spaces at the corners of each block of logic cells at the intersection of rows and columns of repeater switch units. One type of memory structure could be random access memory, i.e., a RAM structure. Address and data lines of the RAM are connected to the bus lines, as are the write enable and output enable control ports of the RAM. The RAM may be either a single-port or dual-port SRAM. Pairs of adjacent columns of RAM may be addressed by the same set of bus lines. The memory structures could also be non-volatile memory structures.

The object is also met by an FPGA matrix in which repeater switch units connecting the local bus segments associated with a block of logic cells are spaced regularly after every N logic cells, thereby partitioning the cells into N×N blocks of cells, with the cells in each block connectable only to an associated set of local bus segments but not to local bus segments associated with other blocks of cells. Repeater switch units connect each local bus segment to express bus lines at opposite ends of a block, with the repeaters being arranged in a staggered configuration so that each express bus line encounters a repeater unit less often than the local bus lines, for example after every 2·N logic cells.

The object is further met by an FPGA in which a matrix of logic cells have a first set of direct connections to four nearest neighbor logic cells in the same row or column of cells and also have a second set of direct connections to four other diagonally neighboring logic cells.

The object is still further met by an FPGA in which each logic cell includes combinatorial logic in the form of a pair of structures that may function as look-up tables, user-accessible memory elements or both. These structures are both addressable by a common set of inputs and whose outputs are selectively available to the same set of outputs, where either output has selective access to a register, and where yet another input to the cell can selectively output one or the other memory element output to effectively combine both memory elements into a single larger, fully addressable memory element. Two of the memory element address inputs can receive inputs selectable from any of four direct connect inputs or a local bus input.

Further, global clock signals, of which there may be many for each column of cells to select from, may have polarity and enable selection based on a sector of plural cells in a column of cells. Global set or reset signals may also have polarity and enable selection on a sector-by-sector basis.

I/O pads may be connectable to multiple logic cells on the perimeter of the matrix of cells and may also be connectable to multiple rows or columns of bus lines. Each perimeter logic cell and row or column of bus lines may be connectable to any of several I/O pads. There can be additional I/O pads connectable only to bus lines.

BEST MODE OF CARRYING OUT THE INVENTION

Figure 1:
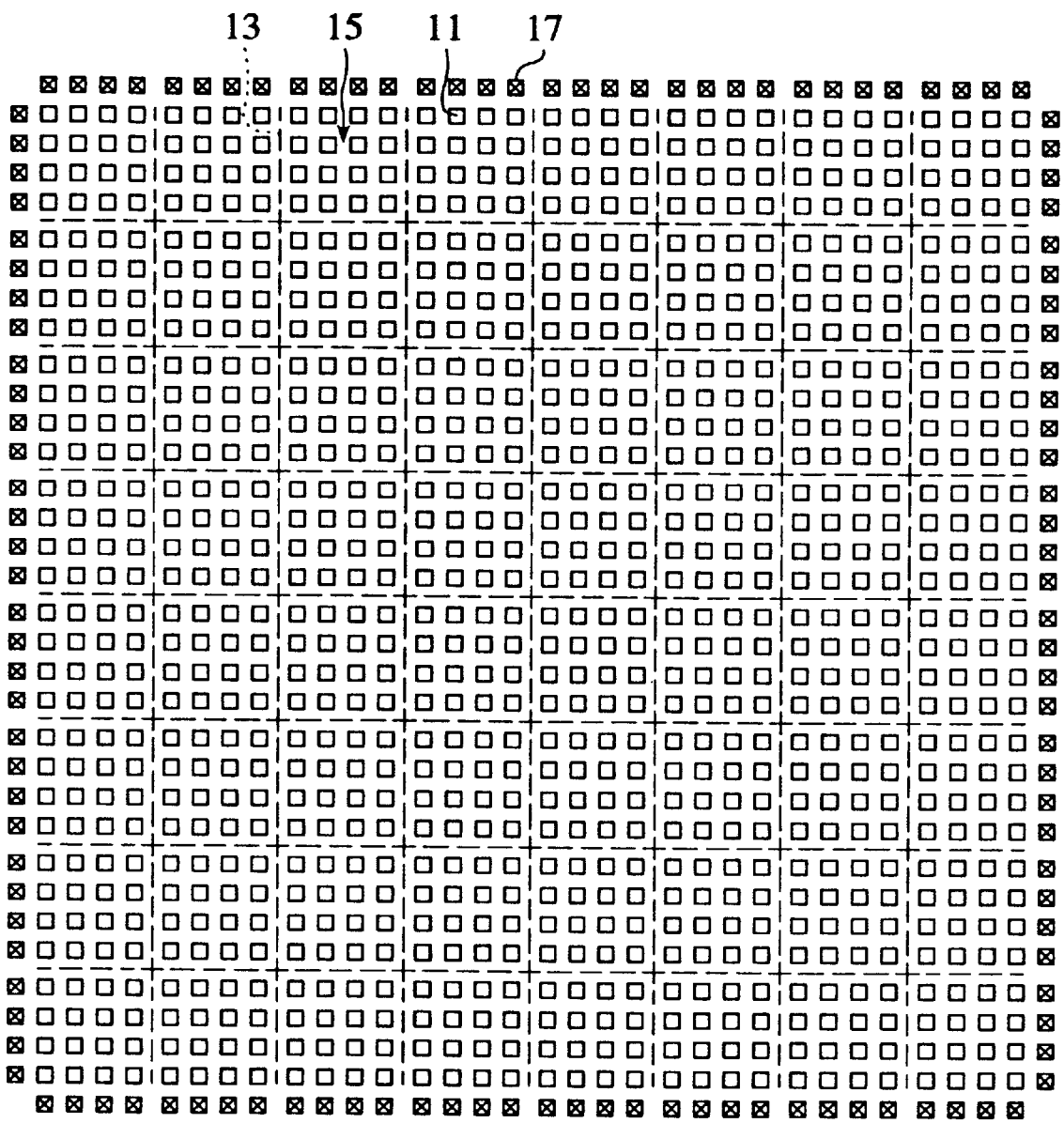
FIG. 1 is a schematic top plan view of an FPGA circuit of the present invention.
Figure 2:
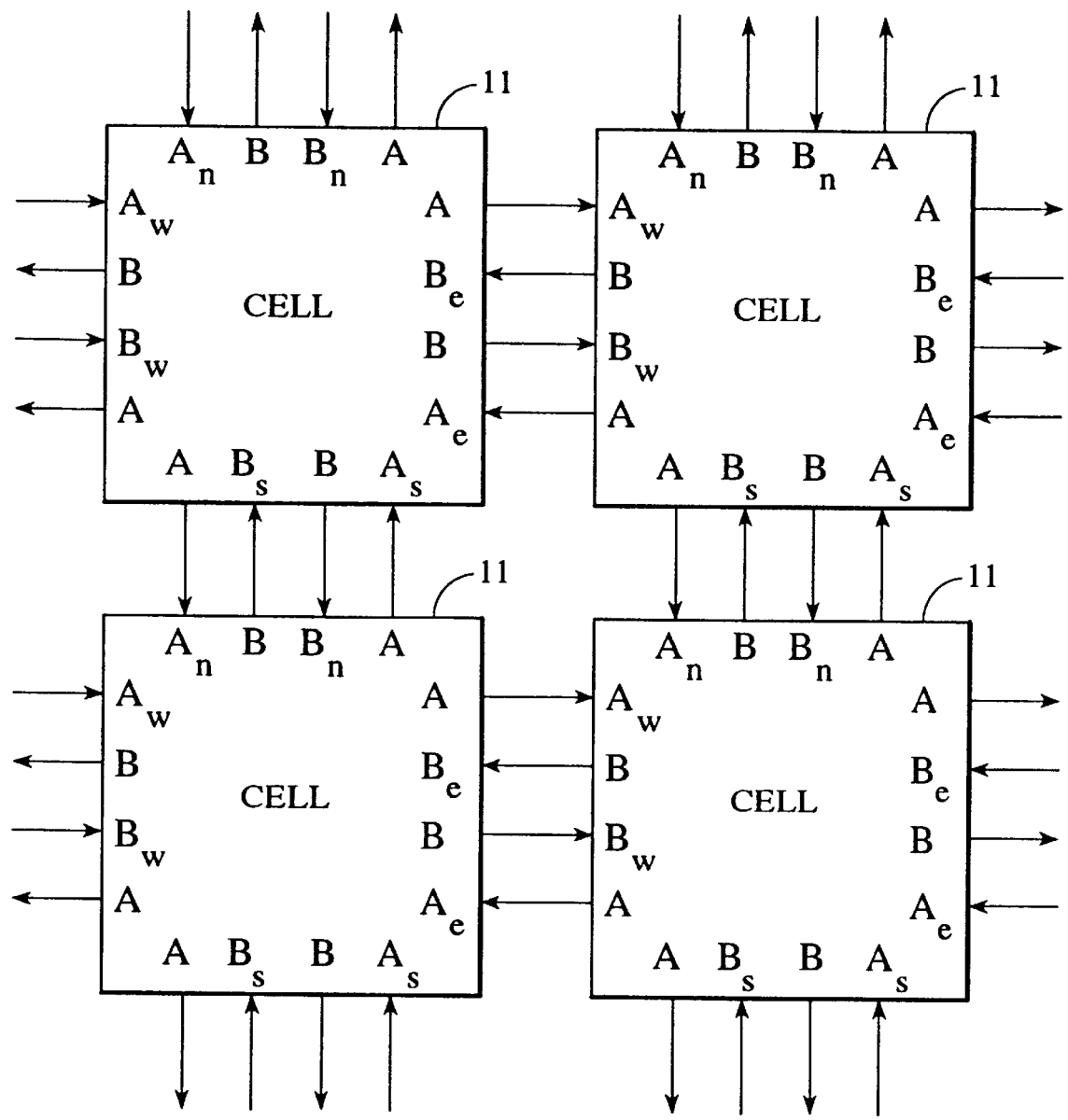
FIG. 2 is a schematic top plan view of four logic cells of the FPGA circuit of FIG. 1, illustrating direct connections between cells.
Figure 3:
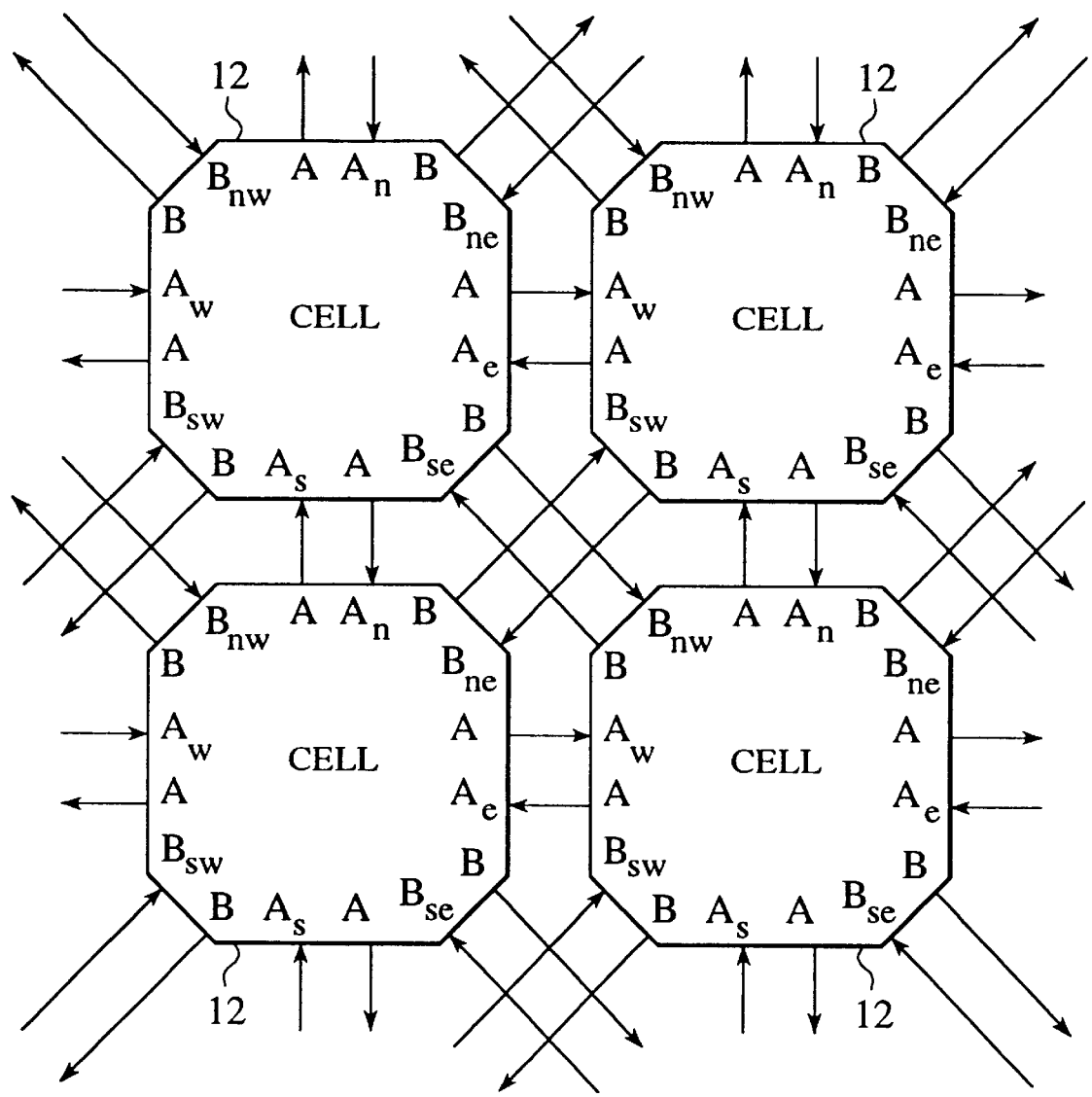
FIG. 3 is a schematic top plan view of four logic cells of an FPGA circuit of the present invention illustrating an alternate embodiment of direct cell-to-cell connections.
Figure 4:
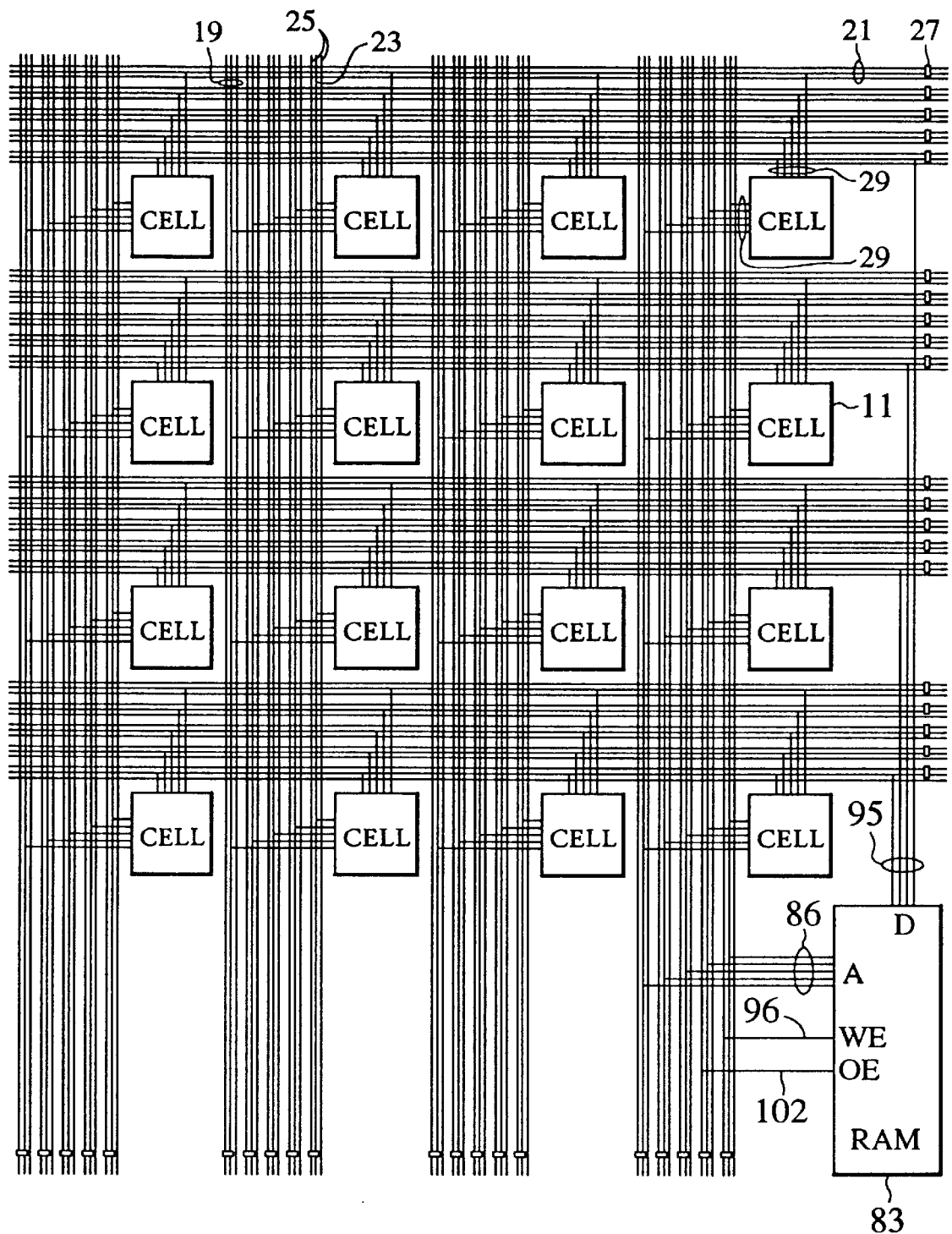
FIG. 4 is a schematic top plan view of a 4×4 block of logic cells of the FPGA circuit of FIG. 1 with bussing network and RAM.

With reference to FIG. 1, a field programmable gate array (FPGA) integrated circuit of the present invention includes a matrix or two-dimensional array of plural rows and columns of programmable logic cells 11. Each of the individual logic cells 11 can be configured or programmed to carry out a specified logic function. The cells are connected together, both directly to neighboring cells as seen in FIG. 2 or 3 and through a network of bus lines with connecting switches as seen in FIG. 4, to achieve a more complex overall logic function of the entire FPGA device or chip which is a composite of the much simpler functions provided by each of the individual cells. Thus, in FPGA devices, the function need not be calculated as a two-level sum of products, because the interconnect structure makes it possible to feed an output of any logic cell to an input of any other logic cell, thereby forming a chain of logic cells that can generate a function with many levels of logic.

Figure 11:
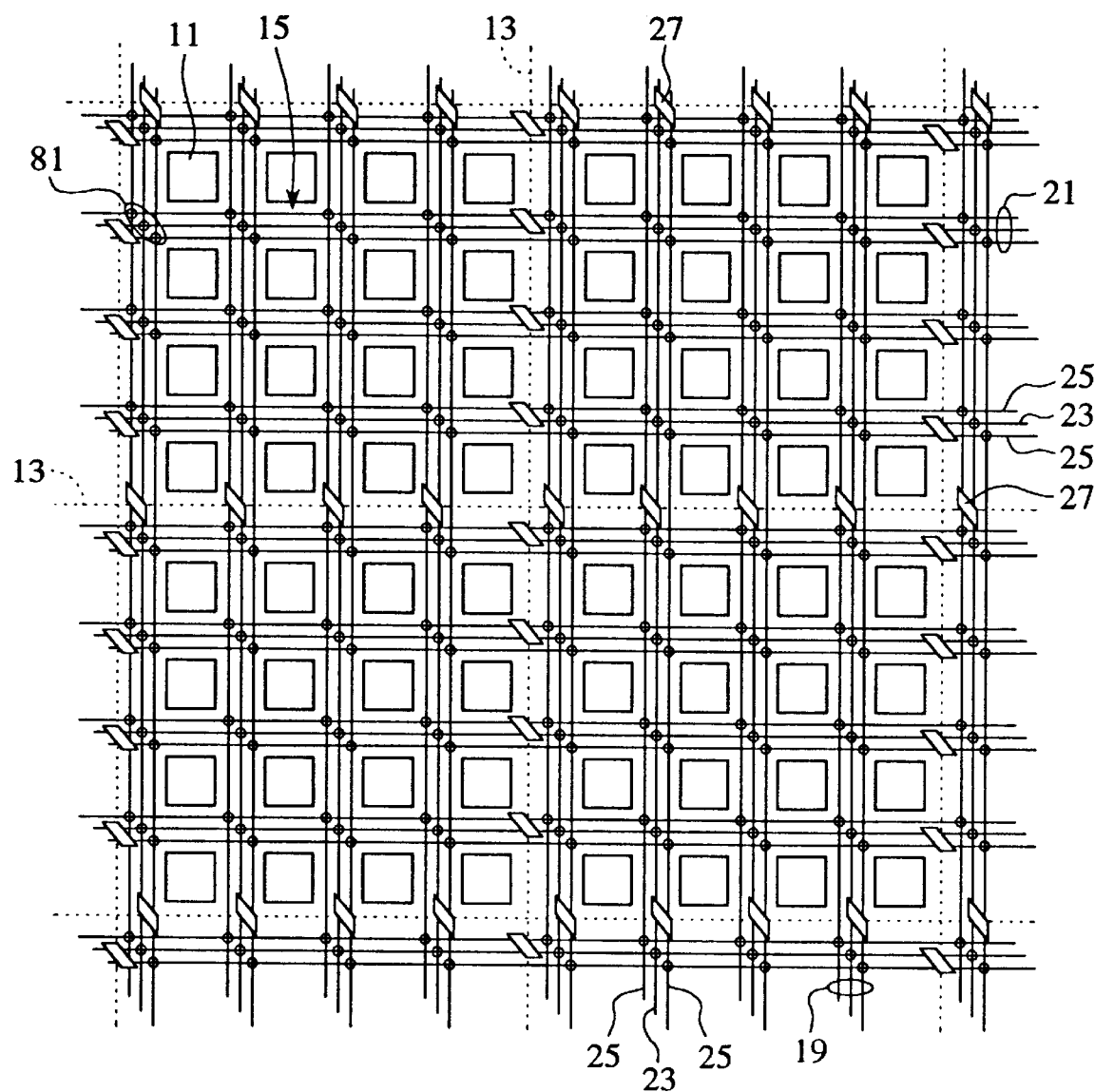
FIG. 11 is a schematic top plan view of four blocks of cells of FIG. 4, illustrating the staggered arrangement of repeater switch units in the FPGA circuit of the present invention.

The pattern of local and express bus lines and of their connecting repeater switches in the bus network of FIG. 11 partitions the basic array of logic cells into smaller rectilinear blocks of cells. The set of dashed lines 13 seen in FIG. 1 represent this partitioned arrangement in which groups of 16 logic cells are organized into 4×4 square blocks of cells. Each block 15 has its own set of associated local bus segments dedicated to that particular group of logic cells, as will be seen below with reference to FIGS. 4 and 11, while express bus lines extend over more than one block for routing signals between the different blocks of logic cells. While the circuit shown in FIG. 1 has 32 rows and columns of cells (a total of 1024 logic cells), which are organized as an 8×8 matrix of 4×4 cell blocks, other devices typically may have as few as 16 rows and columns of cells or as many as 64 (or more) rows and columns of cells. Blocks 15 of logic cells 11 need not have the same size over the entire FPGA device. For example, different quadrants of the device may contain 4×4, 6×6 or 8×8 square blocks or 4×6, 4×8, 6×8, 6×12 or 8×16 rectangular blocks, etc.

The FPGA circuit also has input/output (I/O) pads 17 connected to the bus lines and to the logic cells along the perimeter of the matrix of cells, allowing signals to be transmitted to and from the chip. Details of the input/output pad connections will be discussed below with reference to FIGS. 16–21.

FIG. 2 shows the cell-to-cell direct connections for one embodiment of the circuit. Each logic cell 11 has a first set of identical A outputs and a second set of identical B outputs. The A outputs from any cell are connected to all four adjacent nearest neighbor logic cells in the same row or column as the outputting cell. Likewise, the B outputs from the cell are also connected to all four nearest neighbor cells. Each logic cell also has a set of A inputs (designated $A_n$, $A_e$, $A_s$, $A_w$) receiving signals output by the respective A outputs of the four nearest neighbor cells. Finally, each logic cell has a set of B inputs (designated here as $B_n$, $B_e$, $B_s$, $B_w$) receiving signals output by the respective B outputs of the four nearest neighbor cells. Thus, between any two neighboring cells in the same row or column, there are four connecting signal paths with two paths going in each direction.

FIG. 3 shows cell-to-cell direct connections for an alternate embodiment of an FPGA circuit in accord with the present invention. In that embodiment, each logic cell 12 has a first set of identical A outputs and a second set of identical B outputs. The A outputs from any cell are connected to all four adjacent nearest neighbor logic cells in the same row or column as the outputting cell, but the B outputs from the cell are connected to the four diagonally adjacent neighboring cells. Each logic cell also has a set of A inputs (designated $A_n$, $A_e$, $A_s$, $A_w$) receiving signals output by the respective A outputs of the four nearest neighbor cells in the same row or column as the receiving cell, and a set of B inputs (designated $B_{nw}$, $B_{ne}$, $B_{se}$, $B_{sw}$) receiving signals output by the respective B outputs of the four diagonally adjacent neighboring cells. Thus, each logic cell connects to all eight neighboring cells, and between any two cells there are two connecting signal paths, one going in each direction.

FIG. 4 shows the cell-to-bus connections in the FPGA circuit. The 4×4 group of logic cells 11 in a single block have bus lines distributed between the rows and columns of cells. In particular, there may be five sets of three vertical bus lines 19 adjacent to each column of logic cells and five sets of three horizontal bus lines 21 adjacent to each row of logic cells. Each set of three bus lines includes one local bus line 23 and two express bus lines 25. Logic cells 11 are directly connected only to the local bus lines 23, with access to the express bus lines 25 being indirect through the local bus lines at connective repeater units 27 located at the perimeter of each block of cells. As will be explained below with reference to FIG. 11, the repeaters 27 have bus connections that are staggered such that each express bus line only encounters a repeater after every 8 cells, rather than every 4 cells. Each logic cell 11 has 10 bidirectional data bus lines 29 connecting the logic cell to the 5 horizontal local bus lines and to the 5 vertical local bus lines adjacent to the respective row and column of cells in which that particular logic cell is located. These 10 bidirectional lines 29 (designated V0–V4 and H0–H4 in FIG. 6) connect to their corresponding logic cell, in a manner that will be described in greater detail below with reference to FIG. 6, to provide data signal paths through which cell inputs ($A_L$, $B_L$, $C_L$ and $D_L$ in FIGS. 5 and 6) and cell outputs (L in FIGS. 5 and 6) may be communicated between the logic cells and the bus network.

Figure 5:
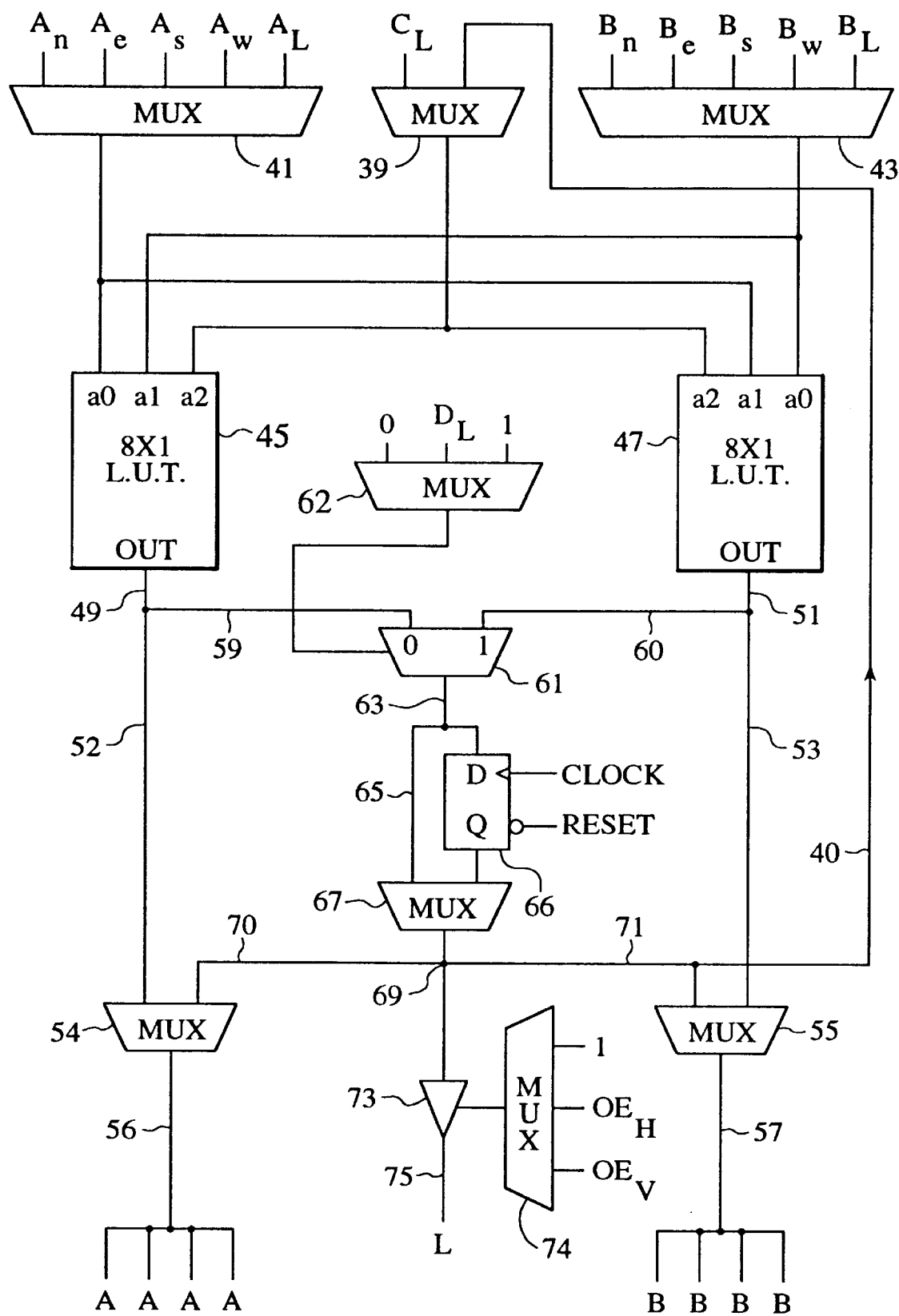
FIG. 5 is a schematic logic level circuit diagram of one logic cell of the FPGA circuit of FIG. 1.

With reference to FIG. 5, one embodiment of a logic cell in the FPGA of the present invention has four sets of inputs, including those designated as A inputs (direct connections $A_n$, $A_e$, $A_s$, $A_w$ from neighboring cells and a local bus input $A_L$), a second set designated as B inputs (direct connections $B_n$, $B_e$, $B_s$, $B_w$ from the neighboring cells and a local bus input $B_L$), a third local bus input designated as $C_L$, and a fourth local bus input designated as $D_L$. The logic cell also has three sets of outputs, including A outputs and B outputs connected to the respective A inputs and B inputs of the four neighboring cells, and also including a local bus output L. The A and B outputs and the direct A and B inputs are connected as described above with reference to FIG. 2. The local bus inputs ($A_L$, $B_L$, $C_L$, $D_L$) and local bus output (L) of a cell are connected to the ten neighboring horizontal and vertical local bus lines 23 through connecting signal paths 29 as previously described with reference to FIG. 4 and in greater detail in the manner shown in FIG. 6. In particular, in FIG. 6, each of the local bus connecting signal paths (H0–H4 and V0–V4) pass through a corresponding pass gate 31 to one of five intermediate signal lines $33_0$–$33_4$ within the cell. Each intermediate signal line $33_0$–$33_4$ can be coupled by the pass gates 31 to either of two local bus connecting signal paths, one of them from a corresponding vertical bus line (via paths V0–V4) and the other from a horizontal bus line (via paths H0–H4). In turn, each of these five intermediate signal lines $33_0$–$33_4$ is connected to four bus input select multiplexers $35_A$–$35_D$. Thus, each multiplexer $35_A$–$35_D$ has five inputs, one for each intermediate signal line $33_0$–$33_4$. The output of each multiplexer $35_A$–$35_D$ form the four local bus inputs ($A_L$, $B_L$, $C_L$, $D_L$) of the cell. Hence, any one of the ten neighboring local bus lines to which the logic cell is connected can provide input signals to any one of the four local bus inputs, as configured by the pass gates 31 and the selections of the multiplexers $35_A$–$35_D$. The local bus output L for the logic cell also connects to the five intermediate signal lines $33_0$–$33_4$ through a set of pass gates 37. Hence the output L can be connected to provide output signals to any of the ten neighboring local bus lines, as configured by the pass gates 37 and 31. If desired, the output L can be connected to both a horizontal bus line and a vertical bus line at the same time, by enabling both corresponding connecting pass gates 31. While usually, one of the intermediate signal lines 33 is selected by a pass gate 37 for use of the local bus output L and the other four intermediate signal lines 33 are selected by the multiplexers $35_A$–$35_D$ (and disabling the corresponding output pass gates 37) for receipt of local bus input signals, the user has the option of configuring the output pass gates 37 and input select multiplexers $35_A$–$35_D$ for providing a feedback path from the local bus output L to any of local bus inputs $A_L$, $B_L$ or $D_L$ if extra feedback paths are needed. (As seen in FIG. 5, the internal cell structure already allows selection of feedback versus the $C_L$ local bus input by the multiplexer 39.)

Returning to FIG. 5, the internal logic of each logic cell may include two 8-bit look-up tables (L.U.T.s) 45 and 47 that are addressed by the A, B and C inputs. The look-up tables typically consist of static RAM memory cells that are operated as read-only memory, i.e., that are loaded during initial configuration of the FPGA device and are not dynamically reprogrammed during operation. The set of A inputs ($A_n, A_e, A_s, A_w, A_L$) are received by a multiplexer 41 and one of them is selected. The selected output of this A multiplexer is connected to the $a_0$ address input of the first L.U.T. 45 and the $a_1$ address input of the second L.U.T. 47. The set of B inputs ($B_n, B_e, B_s, B_w, B_L$) are likewise selected by a B input select multiplexer 43 and the selected output is connected to the $a_0$ address input of the second L.U.T. 47 and the $a_1$ address input of the first L.U.T. 45. A third multiplexer 39 receives the local bus input $C_L$ and an internal feedback signal on the feedback line 40, and outputs one of them to the $a_2$ address inputs of the first and second L.U.T.s 45 and 47. The logic cell uses the two 8-bit look-up tables 45 and 47 to provide a wide variety of combinatorial logic. The SRAM memory cells of the two L.U.T.s 45 and 47 store a set of data bits whose values correspond to the truth table for a particular logic function. When a set of input signals are presented at each of the L.U.T.s three address inputs ($a_0$–$a_2$), the two tables read the respective bit values stored at the addresses designated by those input signals. Thus, each L.U.T. 45 and 47 provides on its respective output 49 and 51 a one-bit output signal which is a particular function of the set of inputs, where the function implemented by the memory is determined by the stored truth values.

The outputs 49 and 51 of the look-up tables 45 and 47 branch into a number of signal paths leading both to the cell's A and B outputs and to the local bus output L. In particular, the L.U.T. outputs 49 and 51 are connected to respective data lines 52 and 53 which may be coupled by respective first and second output multiplexers 54 and 55 to the output lines 56 and 57 providing output signals to the respective A and B outputs. The L.U.T. outputs 49 and 51 also connect to respective second data lines 59 and 60 leading to yet a third output multiplexer 61. The control signal for the multiplexer 61 is derived from the local bus input $D_L$ or from a fixed logic level signal ("0" or "1") as selected by a multiplexer 62. When the logic "0" signal is selected, the third output multiplexer 61 transmits the output of the first look-up table 45 received via second data line 59 to its output 63, but when the logic "1" signal is selected, the third output multiplexer 61 transmits the output of the second look-up table 47 received via the other second data line 60 to its output 63. When the local bus input $D_L$ is selected, control of the third output multiplexer 61 is dynamic. In effect, the two 8-bit look-up tables 45 and 47 then act together as a single 16-bit look-up table, where the local bus input $D_L$ acts as a fourth address input for accessing the desired data bit stored in the combined look-up table. The selected third multiplexer output 63 is split into two parallel paths, one a combinatorial or nonregistered path 65, the other a registered path containing a flip-flop 66. A fourth output multiplexer 67 connects one of those two paths to its output 69. The fourth multiplexer output 69 also splits into several parallel paths. One of these paths 70 leads to the first output multiplexer 54 for possible selection and coupling to the A outputs of the cell, and another of these paths 71 leads to the second output multiplexer 55 for possible selection and coupling to the B outputs of the cell. A third path leads through an output buffer 73 to an output line 75 providing output signals to the cell's local bus output L. The output buffer 73 may be a tristate buffer controlled by an enable signal provided by yet another multiplexer 74. Selectable options include a logic "1" signal in which the buffer 73 is always enabled and two dynamic output enable signals $OE_H$ and $OE_V$ received from dedicated bus lines. A fourth path for the fourth multiplexer output 69 is a feedback path 40 leading to the input multiplexer 39 for possible selection in place of local bus input $C_L$.

Figure 6:
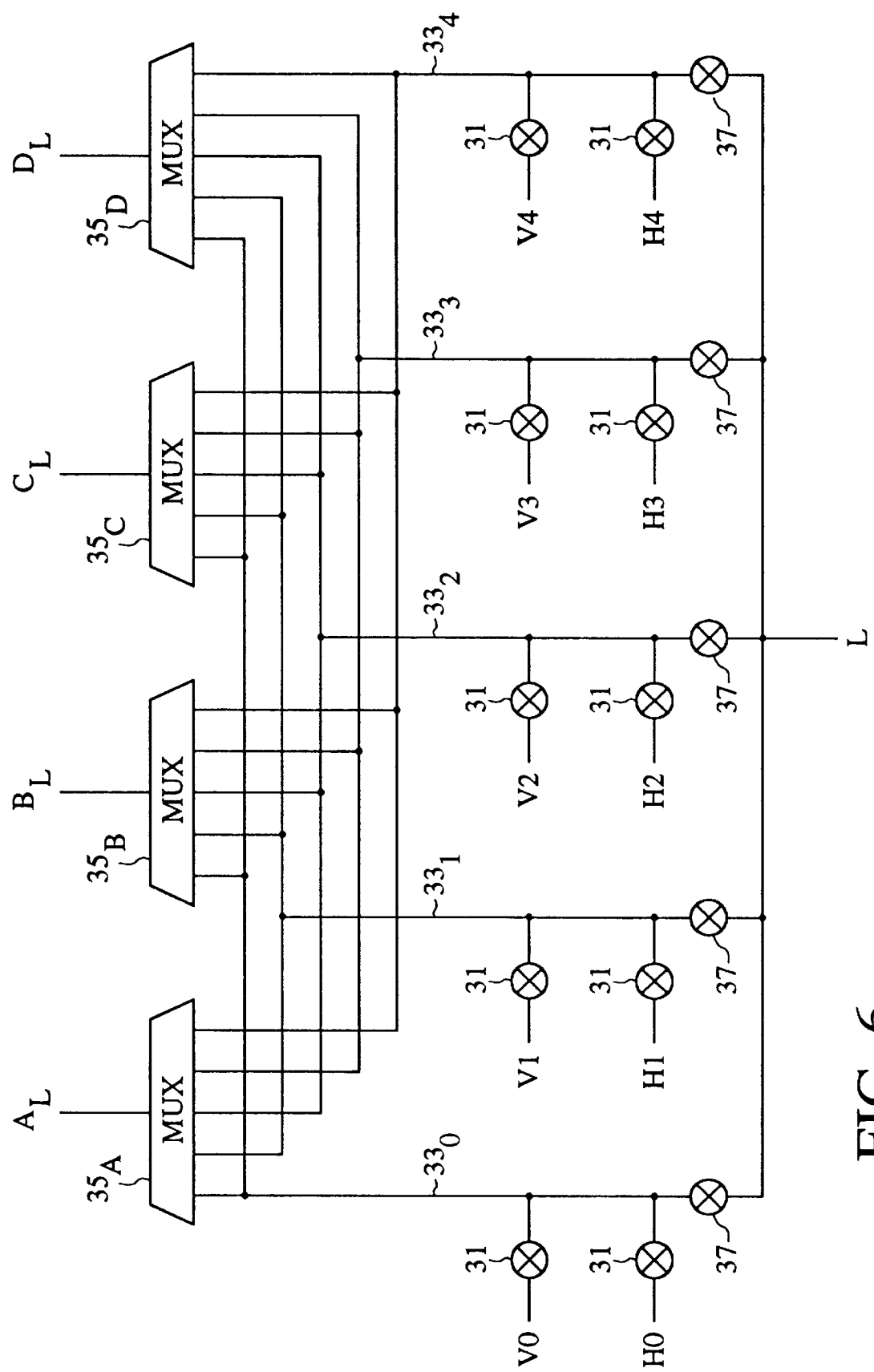
FIG. 6 is a schematic circuit diagram of a cell-bus interface for the logic cell of FIG. 5.

The cell's structure gives it considerable flexibility, while maintaining relative simplicity and compact size. The A and B input multiplexers 41 and 43 provide complete symmetry with respect to the four nearest neighbor cells. Likewise, the local bus input circuitry of FIG. 6 provides complete identity of options for all ten of the cell's local bus connections. At the output end of the cell, the A and B outputs are provided with matching options. The A outputs can be provided with the output of the first look-up table 45, either nonregistered via direct signal line 52 or registered via the second signal line 59, the register 66 and signal line 70. Or it can be provided with the output of the second look-up table 47, via the second signal line 60 and signal line 70, again either registered or nonregistered. Or it can be provided with the output, registered or nonregistered, of the combined 16-bit L.U.T. when local bus input $D_L$ is selected by multiplexer 62 to act as a fourth address input. Likewise, the B outputs can be provided with the output of the second look-up table 47, the first look-up table 45, or the combined 16-bit look-up table, and any of these outputs can be either registered or nonregistered. The same options are also available to the cell's local bus output L.

In addition to the symmetric and flexible input and output selection options, the cell structure results in relatively fast throughput from the inputs to the direct cell-to-cell outputs of the cell. Due to the cell's simplicity, there may be as few as three circuit elements between an input and output of the cell. In particular, the A, B, C and D input signals pass through only one selection circuit, namely any of multiplexers 41, 43, 39 and 62, before reaching an address input $a_0$, $a_1$, $a_2$ or the control input of multiplexer 61 that collectively control access to data bits stored in look-up tables 45 and 47. Likewise, on the output side of the look-up tables 45 and 47, a signal provided on look-up table output lines 49 and 51 can pass through just one multiplexer 54 or 55 to reach the A or B outputs of the cell.

Figure 7:
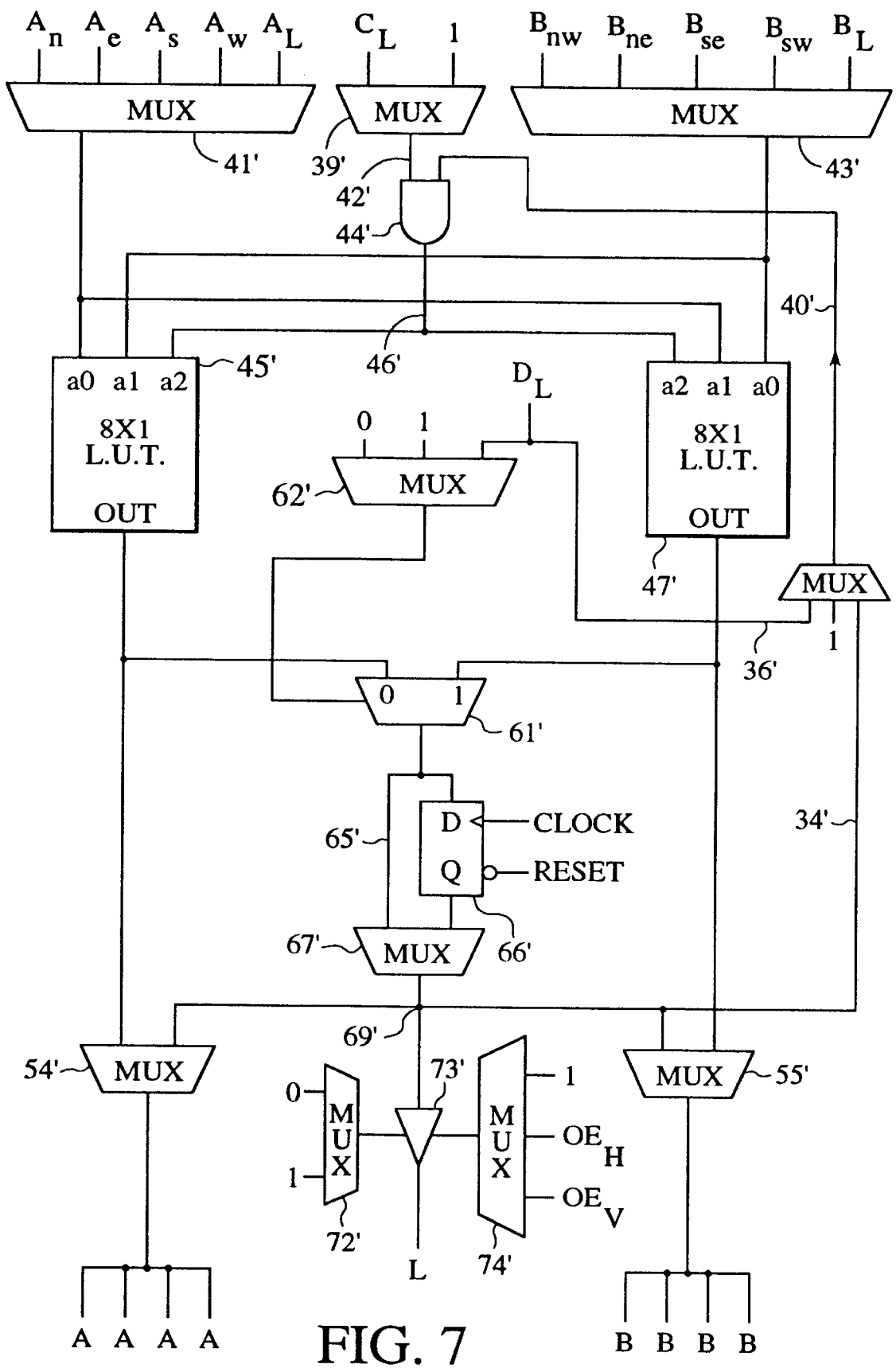
FIGS. 7 and 8 are schematic logic level circuit diagrams of two alternate logic cell embodiments of an FPGA circuit of the present invention.

FIG. 7 shows one alternative logic cell in accord with the present invention. The cell includes a set of input multiplexers 41', 43', 39' and 62' receiving and selecting A, B, C and D inputs. The A inputs, as in FIG. 5, include direct cell-to-cell inputs $A_n, A_e, A_s$ and $A_w$, from adjacent nearest neighbor logic cells in the same row or column as the cell in question, and also include a local bus input $A_L$. The B inputs may also be the same as in FIG. 5, or, alternatively, can include cell-to-cell inputs $B_{nw}$, $B_{ne}$, $B_{se}$ and $B_{sw}$ from diagonally adjacent logic cells, in addition to the local bus input $B_L$. Thus, the B inputs may correspond to the cell-to-cell connections shown in FIG. 3. The input multiplexer 39' selects either a local bus input $C_L$ or a logic "1" signal. Its output 42' connects to one input of an AND gate 44'. A multiplexer 38' selects either a feedback signal on feedback line 34', a local bus input $D_L$, or a logic "1" signal and presents the selected signal on its output 40' to the other input of AND gate 44'. Accordingly, the AND gate 44' may pass either local bus input $C_L$ or $D_L$ or a feedback signal to its output 46', or may logically combine (AND) the local bus inputs $C_L$ and $D_L$ (or the input $C_L$ with the feedback signal) to form the logical product of those two inputs. The cell with the AND gate 44' provides the capability of implementing one element of an array multiplier in a single cell. As in FIG. 5, the selected outputs of input multiplexers 41' and 43' connect to two of the address inputs $a_0$ and $a_1$ of two 8-bit look-up tables 45' and 47'. The output 46' of AND gate 44' connects to a third address input $a_2$ of the look-up tables 45' and 47'.

As in FIG. 5, the outputs of look-up tables 45' and 47' connect through output multiplexers 54' and 55' to respective A and B outputs of the logic cell. The tables 45' and 47' also connect to a third multiplexer 61' controlled by a fixed "0" or "1" control signal or by the local bus input $D_L$, as selected by yet another multiplexer 62'. As before, when the local bus input $D_L$ is selected, the two look-up tables 45' and 47' effectively combine into a single 16-bit table with local bus input $D_L$ acting as a fourth address input. The selected output of third multiplexer 61' connects to a registered/nonregistered selection circuit consisting of a nonregistered signal path 65', a flip-flop register 66' in a registered signal path, and a multiplexer 67' selecting one of these two signal paths. The resulting output 69' connects through multiplexers 54' and 55' to the cell's A and B outputs and through an output buffer 73' to the cell's local bus output L. Again, the output buffer 73' may be a tristate buffer responsive to an output enable signal selected by a multiplexer 74'. FIG. 7 also illustrates that the output buffer circuit 73' may also include output polarity control via yet another multiplexer 72'.

Figure 8:
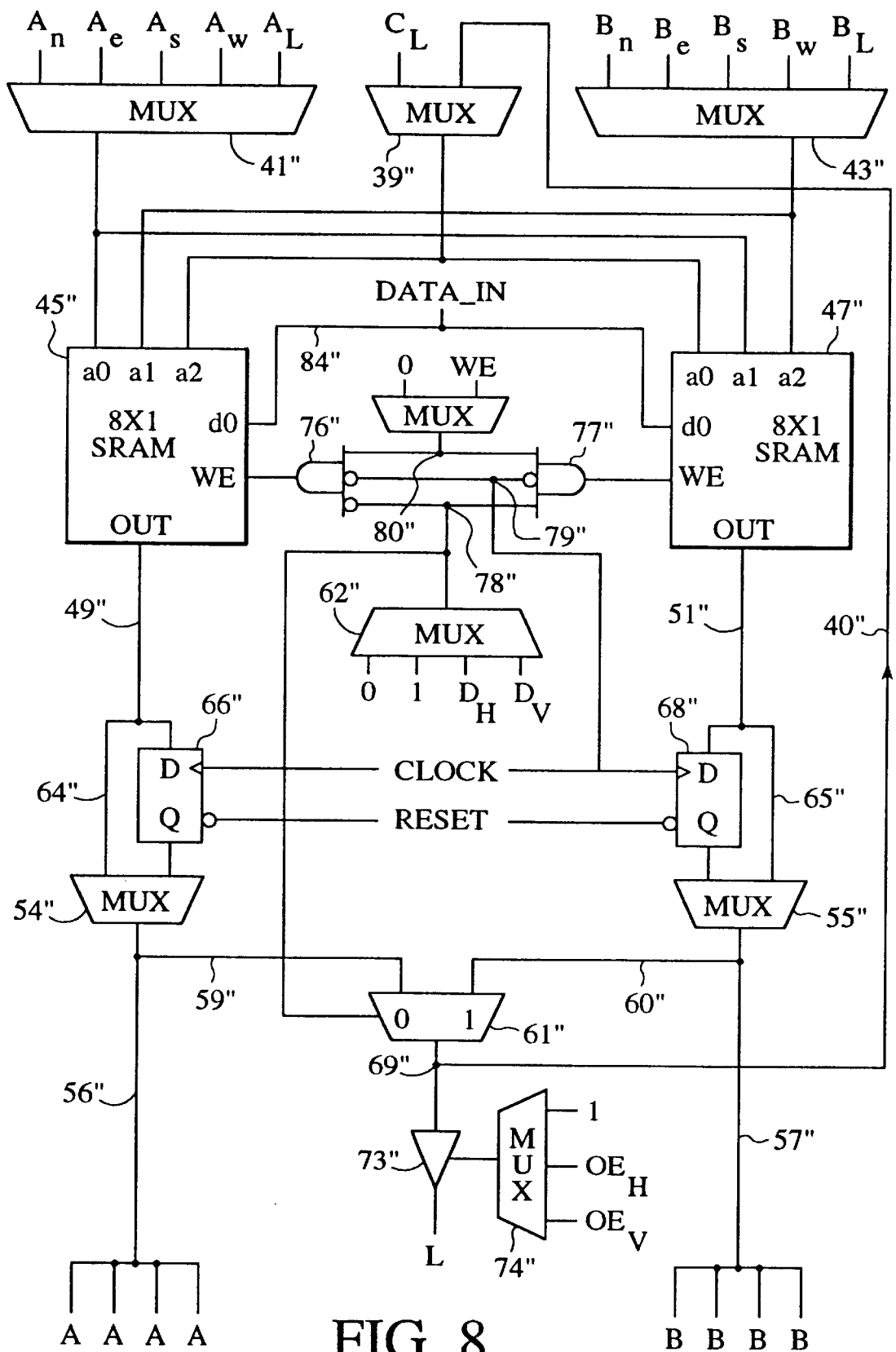

With reference to FIG. 8, another alternative logic cell in accord with the present invention uses two 8×1 static RAMs that are writable during operation of the device by providing write enable and data access to the cell from the bus network. This allows the cells to be used as on-chip memory, or alternatively allows logic functions normally carried out by preloaded and fixed look-up tables to be dynamically changed during operation, e.g. by the device itself as a result of some function carried out by other cells in the FPGA device. In this embodiment, the input multiplexers 41", 43" and 39" are connected to the A, B and C direct and local bus inputs, and the feedback line 40", and to the address inputs $a_0$, $a_1$, and $a_2$ of the SRAMs 45" and 47" in the same manner as in FIG. 5. The outputs 49" and 51" of the SRAMs 45" and 47" each split into a nonregistered path 64" and 65" and a registered path containing a flip-flop 66" and 68" that lead to output multiplexers 54" and 55", respectively. The outputs of multiplexers 54" and 55" lead along signal paths 56" and 57" to the cell-to-cell direct A and B outputs of the logic cell, and also lead along second signal paths 59" and 60" to a local bus output selection multiplexer 61" controlled by a signal selected by a multiplexer 62". The choices include fixed logic low ("0") and logic high ("1") and dynamic local bus inputs $D_H$ and $D_V$ respectively obtained from horizontal and vertical local busses. If a dynamic local bus input $D_H$ or $D_V$ is selected to control output multiplexer 61", then that input effectively acts as a fourth address input for a combined 16-bit SRAM made up of the two 8-bit SRAMs 45" and 47". The selected output 69" from the output multiplexer 61" connects to a feedback line 40" leading to the input multiplexer 39" and also connects through a buffer 73" to a local bus output L. As before, the buffer 73" may have output enable control from a local bus $OE_H$ or $OE_V$ via a multiplexer 74'. Alternatively, the circuitry between the SRAM outputs 49" and 51" and the direct A and B outputs and local bus output L may be as in FIG. 5.

The write access to the SRAMs 45" and 47" unique to this cell embodiment is provided by a DATA_IN line 84" connected to the FPGA's bus network and to data inputs $d_0$ of the two SRAMs 45" and 47", by address inputs $a_0$–$a_2$, and by write enable circuitry providing a write enable signal WE to either of SRAMs 45" and 47". The write enable circuitry includes two AND gates 76" and 77" with three inputs 78"–80" each and each with an output coupled to the write enable input to one of the SRAMs 45" and 47". One of the AND gate inputs 78" receives the same control signal selected by multiplexer 62" as the local bus output multiplexer 61". That is, input 78" selectively receives either fixed logic low ("0") or high ("1") or dynamic local bus input signals $D_H$ or $D_V$. The input 78" is inverted prior to arrival at AND gate 76" but is not inverted prior to arrival at the other AND gate 77". Thus, only one of the SRAMs 45" and 47" will receive a write enable signal at a time. If the input 78" is at a low logic level, the left SRAM 45" will be enabled, but if the input 78" is at a high logic level, the right SRAM 47" will be enabled. Use of the same control signal for the local bus output multiplexers 61" ensures that the data written from DATA_IN line 84" can be verified at the local bus output L. The second AND gate input 79" provides an inverted CLOCK signal to the AND gates 76" and 77" to ensure that the input data to be written is properly established on DATA_IN line 84" prior to the write enable signal WE being delivered to the selected SRAM 45" and 47". The third AND gate input 80" provides the write enable signal WE itself through a multiplexer 82" that allows writing to be selectively disabled (by fixed logic low input "0") for that logic cell.

Figure 9:
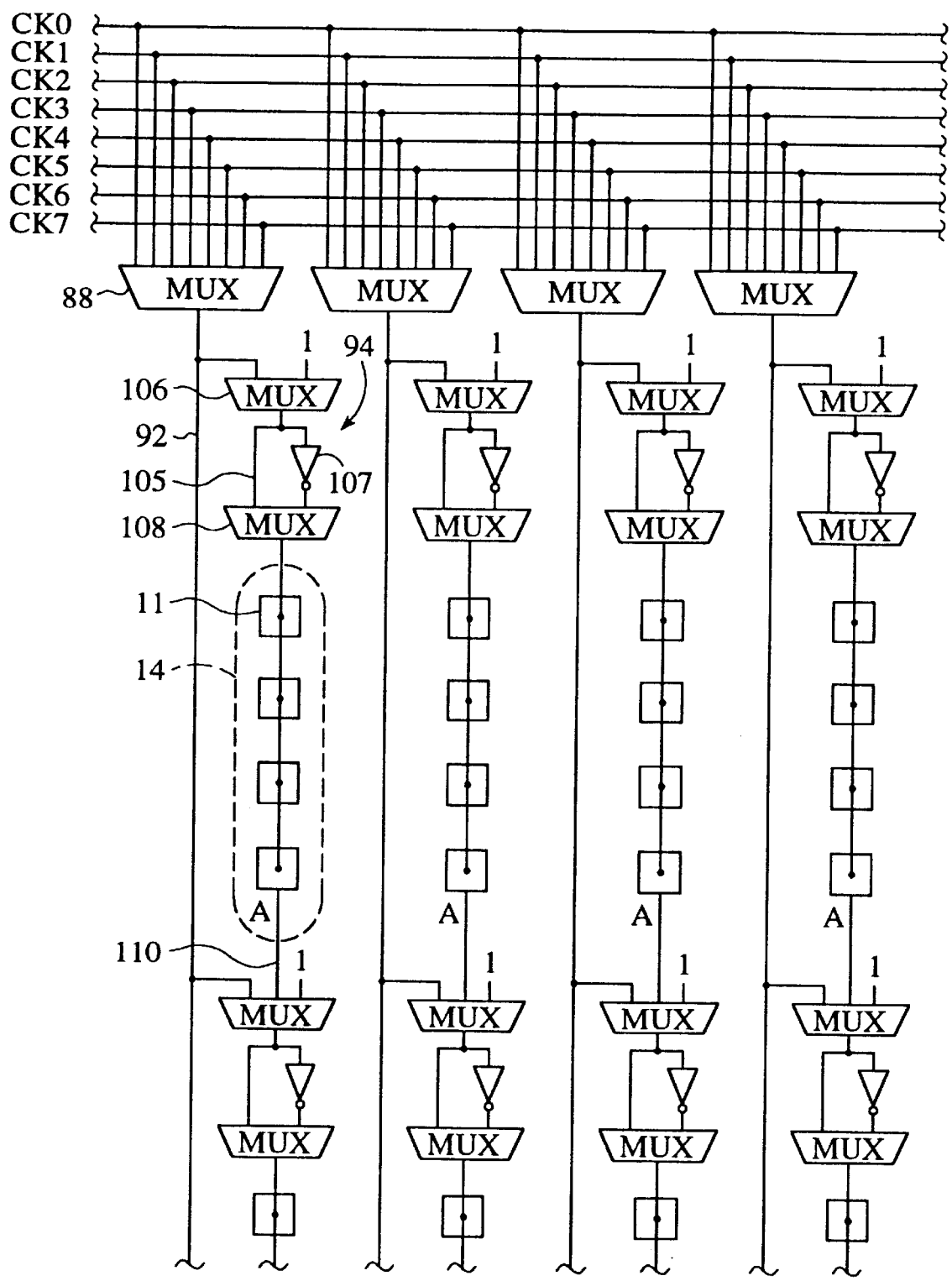
FIGS. 9 and 10 are schematic top plan views of portions of the FPGA circuit of FIG. 1 showing clock and reset signal distribution for the present invention.
Figure 10:
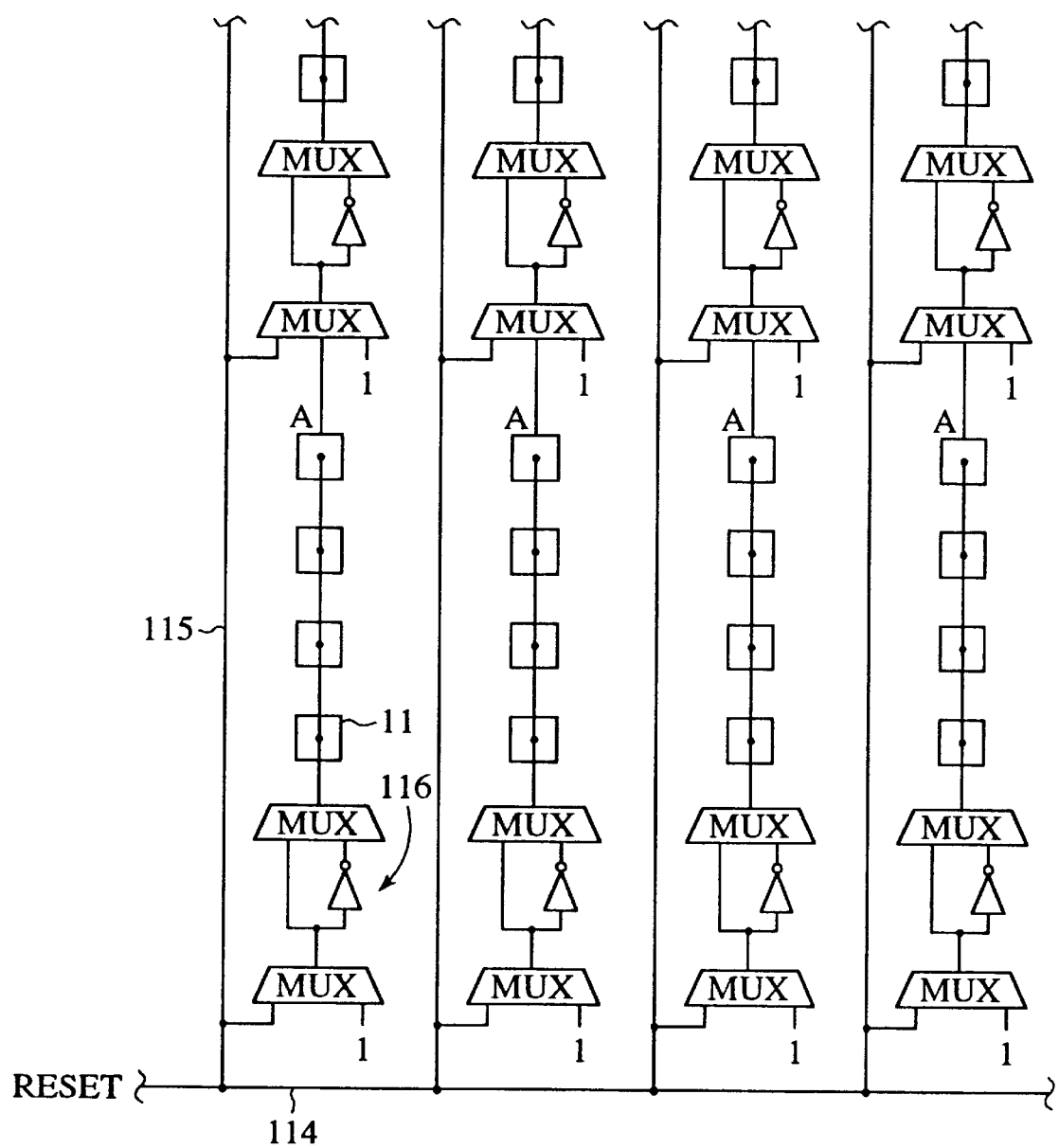

With reference to FIGS. 9 and 10, the flip-flop register (or registers) 66, 66', 66" and 68" in each cell (respective FIGS. 5, 6 and 8) receives a CLOCK input and a RESET (or set) input. FIG. 9 shows clock distribution circuitry for an FPGA of the present invention. There may be multiple global clock lines CK0–CK7 providing clock signals that can differ from each other in frequency, phase or both. Other possible clock distribution arrangements may include some other number of clock lines, partially populating multiplexers 88, etc. Each column of logic cells 11 may be provided with its own clock select multiplexer 88 having inputs respectively connected to some or all of the global clock lines CK0–CK7. Thus, each column of logic cells 11 can be provided with a different clock signal from the other columns of logic cells 11. The output of each clock select multiplexer 88 forms a main column line 92 for distributing the selected clock signal to each of the cells in that column. The column of logic cells may be subdivided into sectors of 4 or 8, or more generally, N cells each. In FIG. 9, a sector 14 is seen to consist of 4 cells. For each sector of cells, a clock polarity-select and distribution-enable circuit 94 branching off of the main column line 92 is provided. This circuit 94 includes a first multiplexer 106 with one input connected to the main column line 92 for receiving a clock signal and another input receiving a fixed logic high ("1") signal. If the clock signal is selected by the multiplexer 106 then that signal is distributed to the corresponding sector 14 of logic cells 11, but if the fixed signal is selected then no clock signal is provided to that sector 14. The circuit 94 further includes a bifurcated signal path (105 and 107) leading to a second multiplexer 108. One input of the second multiplexer comes directly from the output 105 of the first multiplexer 106, while the other input first passes through an inverter 107. Second multiplexer 108 thus enables the polarity of the clock signal to select for the corresponding sector, thereby allowing other sectors in the same column of logic cells 11 to receive the clock signal with the opposite polarity. Finally, some sectors of cells, other than the topmost set of sectors nearest the global clock lines CK0–CK7, may alternately receive a direct A output 110 from a cell in an adjacent sector of cells in the same column.

In FIG. 10, the RESET signal provided by a global RESET line 114 to reset column lines 115 may likewise have its polarity determined by sectors of logic cells by means of reset polarity-select and distribution-enable circuit 116 constructed in the same manner as the clock circuits 94.

With reference to FIG. 11, the logic cells 11 are organized into 4×4 blocks 15 of cells, at the boundaries 13 of which are located a set of connecting switches, called "repeaters", 27, for the bus network. As previously mentioned, the bus network includes sets of horizontal bus lines 21 running between the rows of logic cells 11 and sets of vertical bus lines 19 running between the columns of logic cells 11. Each set of bus lines 19 or 21 includes a local bus line 23 limited to a single block 15 of cells and two express bus lines 25 extending by means of the repeaters 27 through multiple blocks of cells. For simplicity, only one set of three bus lines 23 and 25 is shown for each row and column of cells 11. However, as also previously mentioned there are normally five sets of three bus lines 19 and 21 for each row and column of cells 11, as seen in FIG. 4. The repeaters 27 allow local bus lines 23 to be connected to express bus lines 25. Only local bus lines connect directly to the logic cells 11. The repeaters 27 have a staggered arrangement in which any one repeater 27 provides a selectable connection between a local bus line 23 and only one of the two express bus lines 25 in the set and in which successive repeaters 27 connect to alternate express bus lines in the set. Thus, each express bus line 25 encounters a repeater 27 every eight rows or columns of cells 11 rather than every four rows or columns, while each local bus line 23 encounters a repeater 27 every four rows or columns of cells 11. Each local bus line 23 in a block 15 of cells 11 is connectable to each of its corresponding express bus lines 25 at opposite ends of the block 15. A convenient way of laying out the repeaters 27 to obtain the desired staggered arrangement is to have an entire row or column of repeaters 27 connectable to matching express bus lines in the respective sets of three bus lines (e.g., all connected to the leftmost or topmost express lines) and to have the next succeeding row or column of repeaters 27, four logic cells distant, all connectable to the opposite matching express lines in the set (e.g., all connected to the rightmost or bottommost express lines), and so forth. FIG. 11 also shows that additional switches 81 may be placed where rows and columns of bus lines intersect to allow signals to be turned 90° between rows and columns of bus lines. These switches 81 connect local bus lines to other local bus lines and express bus lines to other express bus lines.

Figure 12:
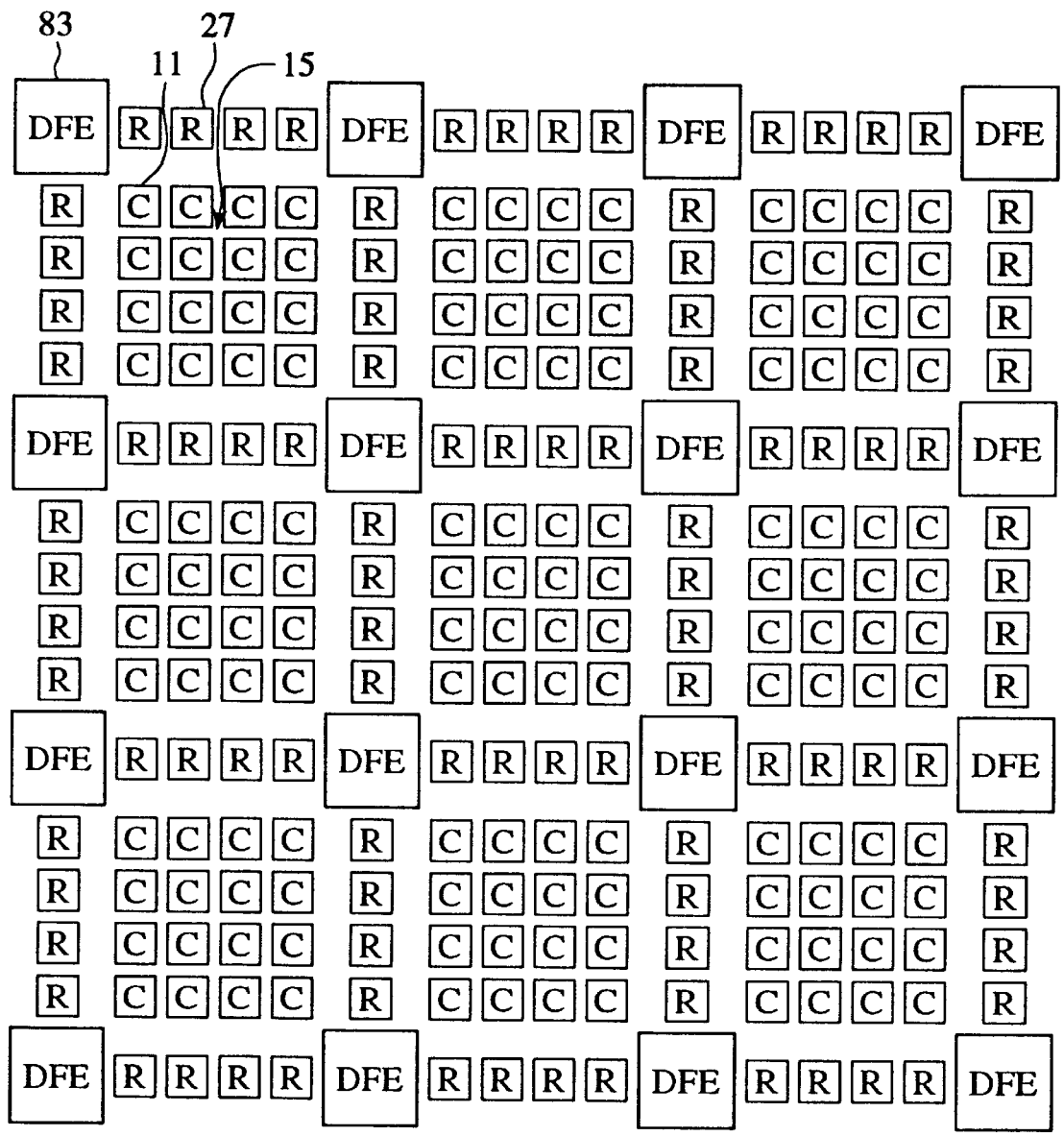
FIG. 12 is a schematic top plan view of a 3×3 set of blocks of cells of the FPGA of FIGS. 1 and 4, illustrating the placement of dedicated function elements (DFE) such as RAM at corners of each block between rows and columns of repeaters.

With reference to FIG. 12, at the corners of each block 15 of logic cells 11 in the spaces provided at the intersections of rows and columns of repeaters 27 bounding the blocks 15 are dedicated function elements 83 (DFE) which can be memory structures such as random access memory (RAM) blocks or other dedicated or specialized circuits, such as multipliers, shift registers, fixed-function digital or analog logic, microcontrollers, comparators, and analog-to-digital or digital-to-analog converters. Since the corner spaces naturally result from the block organization of the cells and their associated bussing and repeaters, the placement of dedicated logic of memory in such spaces comes at little or no cost in silicon area for the overall device.

Figure 13:
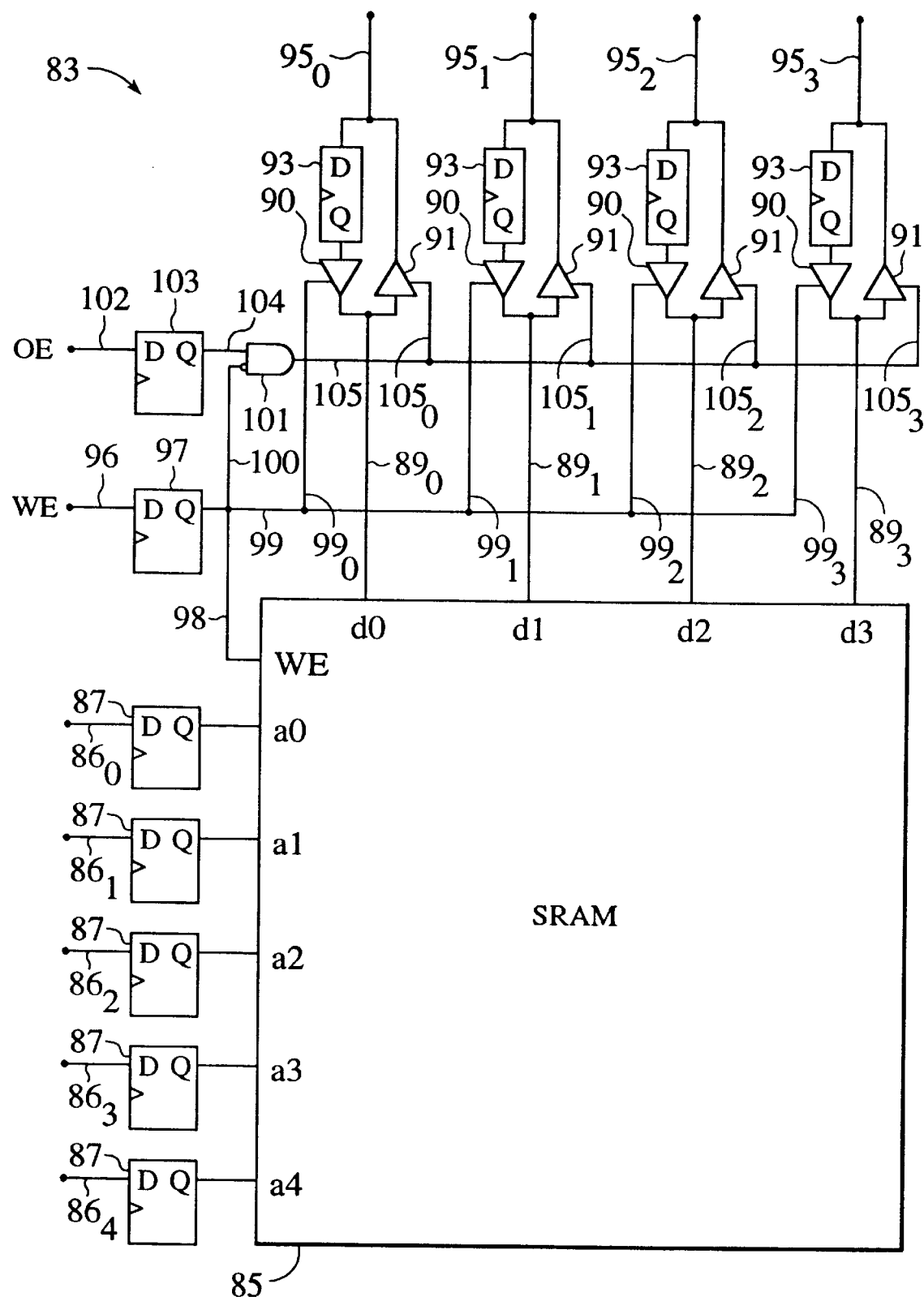
FIG. 13 is a schematic logic level circuit diagram of a RAM and the RAM-bus interface for the FPGA circuit of the present invention.

Each dedicated function element 83 may be a RAM block or other memory structure (such as non-volatile memory), organized as 32 4-bit words of data, for a total of 128 bits per block, as seen in FIGS. 4 and 13. Referring to FIG. 13, each RAM block 83 may comprise an SRAM 85 with five synchronous address inputs $a_0$–$a_4$ receiving address signals from address lines $86_0$–$86_4$ via a set of flip-flop registers 87 and with four bidirectional data ports $d_0$–$d_3$. The data ports $d_0$–$d_3$ connect to respective data lines $89_0$–$89_3$, each of which in turn is connected to a pair of input and output buffers 90 and 91. The input buffers 90 are connected through flip-flops 93 to data lines $95_0$–$95_3$. The output buffers 91 are directly connected to the data lines $95_0$–$95_3$. A write enable signal WE is received from a write enable line 96 via a flip-flop register 97. The register output Q of flip-flop 97 connects via a first branch to a write enable input port of the SRAM 85 and via a second branch 99 through respective side branches $99_0$–$99_3$ to the tristate control inputs of input buffers 90 for each data port $d_0$–$d_3$. An output enable signal OE is also received from an output enable line 102 via a flip-flop register 103. The output 104 of register 103 connects to a first input of an AND gate 101, while a third branch 100 of the output of flip-flop register 97 connects to a complementary second input of the AND gate 101. The output 105 of AND gate 101 connects through respective side branches $105_0$–$105_3$ to the tristate control inputs of output buffers 91 for each data port $d_0$–$d_3$.

Thus, to write data into the SRAM 85, a 5-bit address is synchronously received from the outputs of registers 87 at the address ports $9_0$–$9_4$ and a write enable signal is also synchronously received at the write enable port WE of the SEAM 85 via the first branch 98 from flip-flop register 97. The write enable signal also enables the input buffers 90 via side branches $99_0$–$99_3$ and disables the output buffers 91 via AND gate 101 and side branches $105_0$–$105_3$. Hence, data bits received on data lines $95_0$–$95_3$ are transmitted through the input buffers 90 and data lines $89_0$–$89_3$ to the respective data ports $d_0$–$d_3$ and written into the SRAM 85 at the address received at address ports $a_0$–$a_4$. In order to read stored data from the SRAM 85, an address and an output enable signal OE are synchronously received via registers 87 and 103 at address ports $a_0$–$a_4$ and at AND gate 101, respectively. The write enable signal WE transmitted by register 97 is low, disabling the input buffers 90 via branch lines $99_0$–$99_3$ and allowing the AND gate 101 to enable the output buffers 91 via branch lines $105_0$–$105_3$. Data stored at the received address is output through data ports $d_0$–$d_3$ to data lines $95_0$–$95_3$. As an alternative, the RAM block 83 can be suitably modified so that the write enable and output enable signals are active low.

Returning to FIG. 4, the RAM block 83 of FIG. 13 may be connected to the bus network such that each of the five address lines 86 are connected to a different one of the five vertical local bus lines 23 corresponding to one column of cells 11, the write enable and output enable lines 96 and 102 are connected to two vertical express bus lines 25 corresponding to that same column of cells, and each of the four data lines 95 are connected to a different horizontal local bus line corresponding to each of the four rows of cells 11 in the 4×4 group of cells adjacent that RAM block 83. Other connection schemes are also possible.

Figure 14:
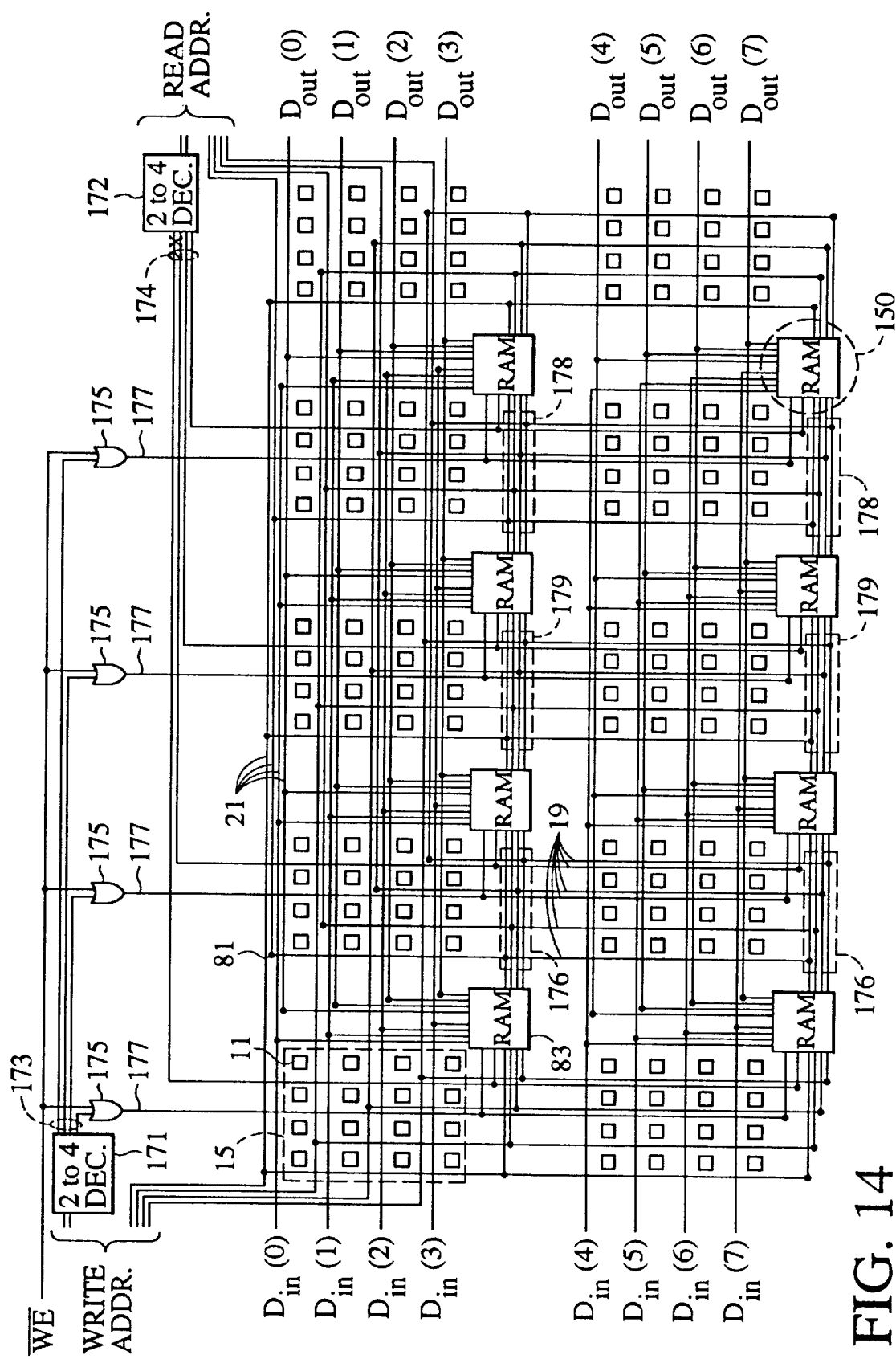
FIG. 14 is a schematic top plan view of a portion of an FPGA circuit of the present invention containing eight blocks of logic cells and their associated RAM blocks, and showing an alternate RAM to bus network connection scheme from that shown in FIG. 4.
Figure 15:
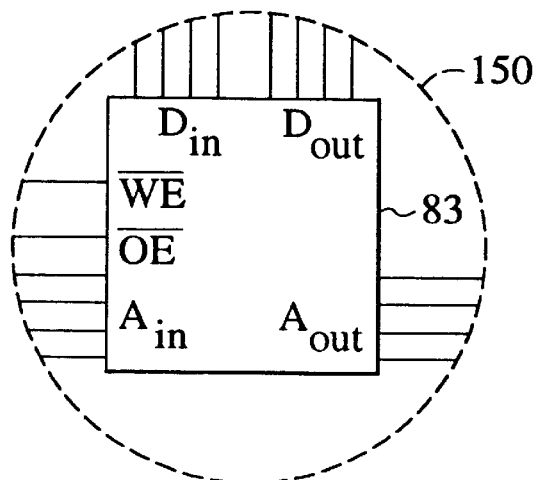
FIG. 15 is an enlarged view of the RAM block in the dashed circle 150 in FIG. 14.

Alternatively, instead of the arrangement shown in FIGS. 4 and 13, the RAM blocks 83 may be connected to the bus network in the manner seen in FIGS. 14 and 15. FIG. 14 shows eight of the 4×4 blocks 15 of logic cells 11, together with some of vertical and horizontal express bus lines 19 and 21 running between the rows and columns of cells 11 in and between the blocks 15. Turning switches 81 connect selected vertical and horizontal bus lines 19 and 21 to each other where they intersect. At the lower righthand corner of each block 15 of logic cells 11 is a RAM block 83. As seen in FIG. 15, each RAM block 83 may be a dual port SRAM with a write enable port $\overline{WE}$, write address ports $A_{in}$ and data input ports $D_{in}$ for write operations to the SRAM, and with a read enable port $\overline{OE}$, separate read address ports $A_{out}$ and separate data output ports $D_{out}$ for reading data from the SRAM. Thus, read and write operations can occur independently and even simultaneously on separate address and data lines.

Returning to FIG. 14, a 6-bit write address (WRITE ADDR.) corresponding to a set of locations in RAM to which 8 data bits are to be written is received from the bus network or from external pads of the device. Two of the six bits are seen to be input into a conventional 2-to-4 bit decoder 171. Decoder 171 activates one and only one of its four outputs 173 depending on which of the four possible two-bit input values it receives. Each of the four decoder outputs 173 is connected into an input of one of four OR gates 175. A global write enable signal $\overline{WE}$ is received at the other input of the four OR gates 175. The OR gate outputs 177 connect to vertical express bus lines 19 corresponding to each of the four columns of blocks 15 and their corresponding columns of RAM blocks 83. The write enable port $\overline{WE}$ of these RAM blocks connect to these particular vertical express bus lines to receive a decoded write enable signal from the corresponding OR gate outputs 177. Thus, for any combination of the two write address bits, one of the four columns of RAM blocks 83 will be activated for a write operation if the global write enable signal $\overline{WE}$ is active. The other four write address bits in the 6-bit address connect to horizontal express bus lines 21 and then through turning switches 81 to vertical bus lines 19 connected to write address ports $A_{in}$ of each RAM block 83. Eight data input lines $D_{in}(0)$–$D_{in}(7)$ connect through horizontal busses 19 adjacent to each row of logic cells 11 to the data input ports $D_{in}$ of the RAM blocks 83, with each RAM block 83 receiving four parallel data input signals from either $D_{in}(0)$–$D_{in}(3)$ or $D_{in}(4)$–$D_{in}(7)$. Thus, two rows of RAM blocks are needed to write single bytes of data to any given address.

Likewise, for read operations, a 6-bit READ ADDRESS is provided with two of the address bits connecting to another 2-to-4 bit decoder 172 providing four outputs 174, one for each column of RAM, and with the four remaining address bits connecting through horizontal express bus lines 21 and turning switches 81 to vertical express bus lines 19 leading to read address ports of the RAM blocks 83. Again, all eight RAM blocks are provided with four address bits, but only one column of RAM blocks are provided with a read enable signal derived from the two address bits input into the decoder 172. Eight data output lines $D_{out}(0)$–$D_{out}(7)$ connect via horizontal express bus lines to the data output ports $D_{out}$ in two rows of RAM blocks 83.

One valuable arrangement provides mirror symmetry between the read and write address ports $A_{in}$ and $A_{out}$ in adjacent columns of RAM blocks 83. This reduces by approximately half the required number of vertical bus resources used for address signals when building a dual port RAM element. Note that in FIG. 14 the first two columns of RAM blocks share common read address lines 176. Likewise, the last two columns of RAM blocks share common read address lines 178. The second and third columns of RAM blocks share common write address lines 179. In larger groups of memory blocks, such as those with eight or sixteen columns of RAM blocks and 3-to-8 or 4-to-16 bit decoders, use of vertical bus resources would alternate from read address lines in one column of logic blocks 15 to write address lines in the next column of logic blocks 15.

The dedicated function elements at the corners of each block of logic cells could also be specialized logic structures, such as multipliers. For example, a 4×4 multiplier can be connected to the bus network in the same way as the dual-port SRAM seen in FIGS. 14 and 15, with one set of address inputs replaced by one four-bit operand and the other set of address inputs replaced by a second four-bit operand. The eight-bit product output of the multiplier replaces the two four-bit data in and data out lines of the RAM.

Figure 16:
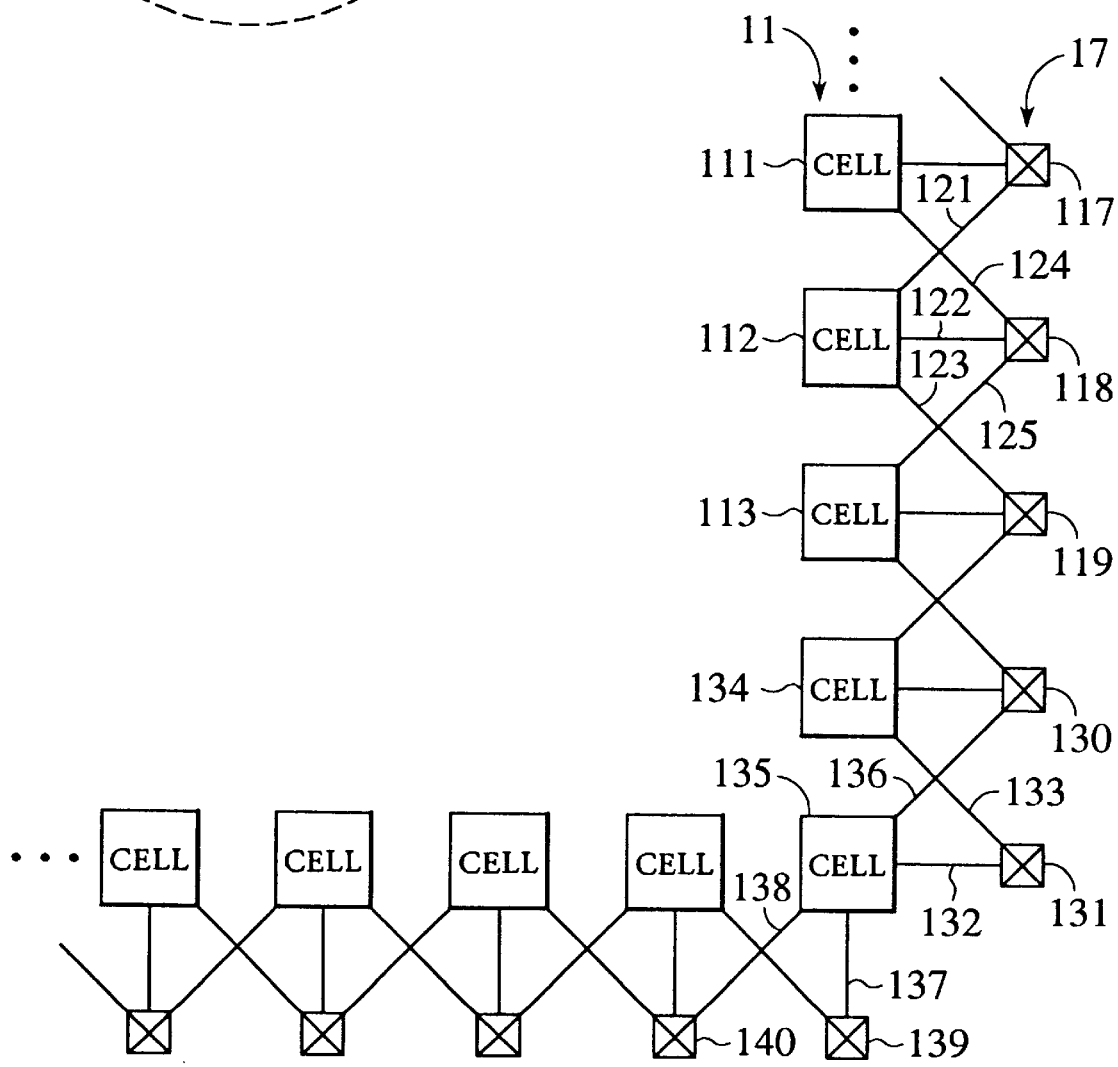
FIG. 16 is a partial schematic diagram of a set of logic cells at the perimeter of the FPGA circuit of FIG. 1, illustrating the connectability of cells to a set of I/O pads for the circuit.

With reference to FIG. 16, the logic cells 11 at the edge of the array may be connected to the input/output (I/O) pads 17 in any of a number of ways. One way shown here connects each logic cell, e.g. cell 112, to three neighboring I/O pads 117–119 via I/O lines 121–123 and also connects each I/O pad, e.g. pad 118, to three neighboring logic cells 111–113 via I/O lines 122, 124 and 125. An exception to this scheme usually occurs at the corners of the array and at the ends of the line of pads. Thus, the end pad 131 connects to only two logic cells 134 and 135 via I/O lines 132 and 133. The corner logic cell 135 connects to four I/O pads, namely pads 130 and 131 in one line of I/O pads and pads 139 and 140 in another line of pads, via I/O lines 132 and 136–138. Other arrangements are possible.

Figure 17:
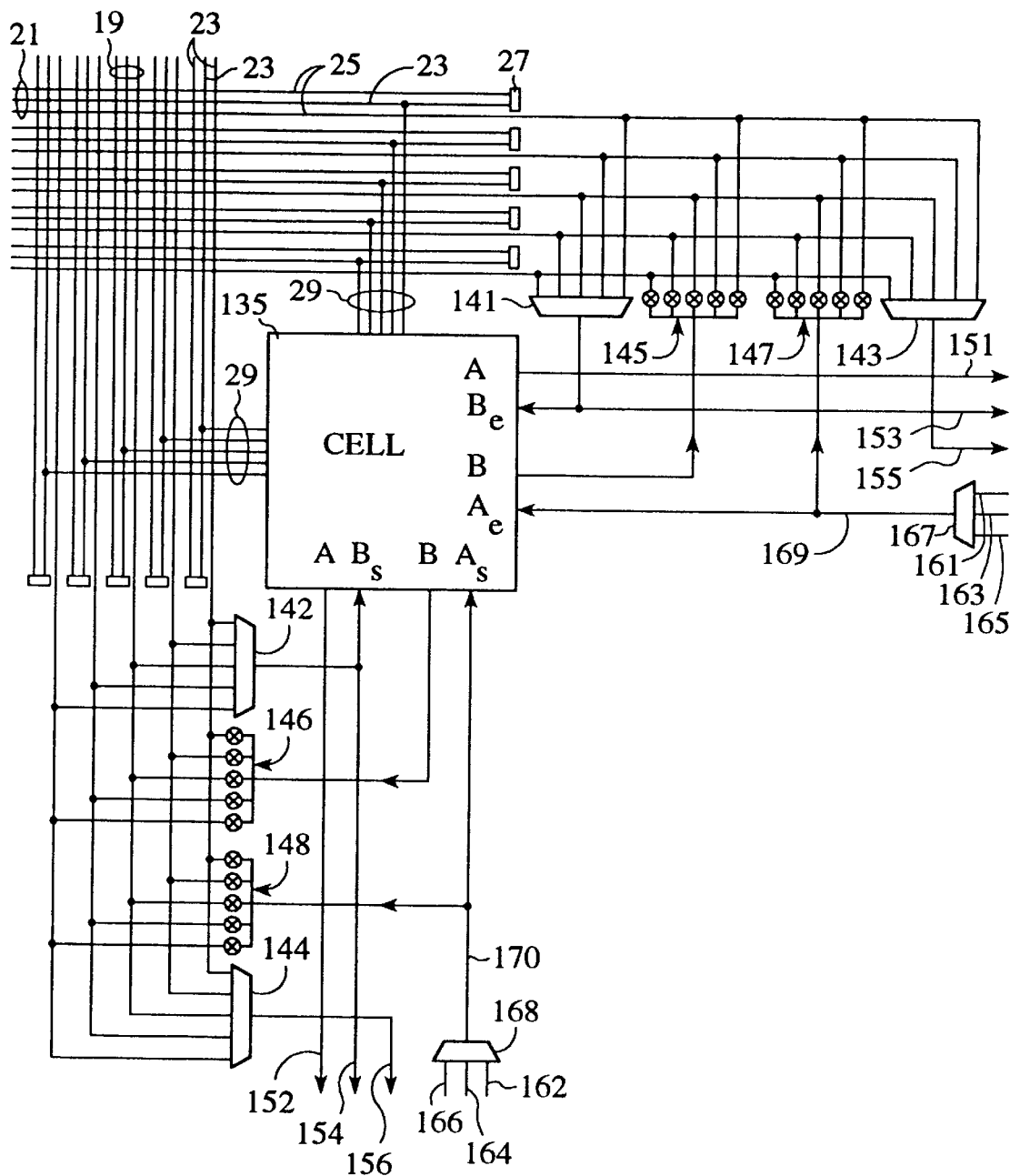
FIG. 17 is a schematic logic level circuit diagram of a corner logic cell of the FPGA and the cell-to-pad interface according to one embodiment of the present invention.

A detail of the corner connection scheme is shown in FIG. 17. Connects for other logic cells and I/O pads are analogous. The particular logic cell 135 seen in FIG. 17 is the lower righthand corner cell of the array, i.e. the cell in the bottom row and rightmost column in FIG. 1. As seen in FIG. 16, this particular cell 135 connects to the two rightmost I/O pads 139 and 140 in the bottom line of pads and to the two bottommost I/O pads 130 and 131 in the right line of pads of the circuit. The cell 135 in FIG. 17 is connected like all of the other cells in the array to a set of adjacent vertical and horizontal bus lines 19 and 21, either directly to local buses 23 or indirectly to express buses 25 via the local buses 23 and repeatable switches 27. As in FIGS. 4 and 6, the connections between the cell 135 and the 5 horizontal and 5 vertical local bus lines 23 may be made via a set of ten bidirectional data bus lines 29. The corner cell 135 also makes direct connections to the nearest neighbor cells (not shown) as in FIG. 2. However, because the cell 135 lacks neighbors to its right and below it, the four unused A and B direct inputs ($A_E$, $B_E$, $A_S$ and $B_S$) and the four unused A and B direct outputs (two A's and two B's) are used to facilitate the connections to the I/O pads, and to certain express bus lines 25.

In particular, each of the 5 horizontal express lines 25 that does not encounter the end repeater units 27 connects to a pair of 5-to-1 multiplexers 141 and 143 and a pair of five-element sets of switches 145 and 147. Likewise, the 5 vertical express lines 25 that do not encounter end repeater units 27 terminating the column of bus lines are connected to multiplexers 142 and 144 and sets of switches 146 and 148. The outputs of multiplexers 141 and 142 connect to respective direct B inputs $B_E$ and $B_S$ and also to output signal paths 153 and 154 leading to I/O pads. The outputs of multiplexers 143 and 144 connect only to output signal paths 155 and 156 leading to I/O pads. The sets of switches 145 and 146 connect the direct B outputs of the cell 135 to the 10 horizontal and vertical express lines 25 not terminated by repeaters 27. The sets of switches 147 and 148 connect input signal paths 169 and 170 from I/O pads to the same 10 horizontal and vertical express lines 25. The input signal paths 169 and 170 also connect to respective direct A inputs $A_E$ and $A_S$ of the cell 135.

The right-side output signal paths 151, 153 and 155 each go to the bottommost two pads 130 and 131 on the right line of pads and to the rightmost pad 139 on the bottom line of pads in FIG. 16. The bottom-side output signal paths 152, 154 and 156 each go to the rightmost two pads 139 and 140 on the bottom line of pads and the bottommost pad 131 on the right line of pads in FIG. 16. Thus, each of the output signal paths 151–156 is selectively connectable to any of three different pads from the four available pad connections. Signal paths 155 and 156 may also be used to provide a tristate enable signal to an output buffer between the paths 151–154 and the I/O pads. The input signal paths 169 and 170 are likewise connectable to the I/O pads. Conductive lines 161, 163 and 165 connect to respective pads 130, 131 and 139, while conductive lines 162, 164 and 166 connect to respective pads 131, 139 and 140 seen in FIG. 16. The input select multiplexers 167 and 168 each connect a selected conductive line 161–166 to the input signal paths 169 and 170.

Figure 18:
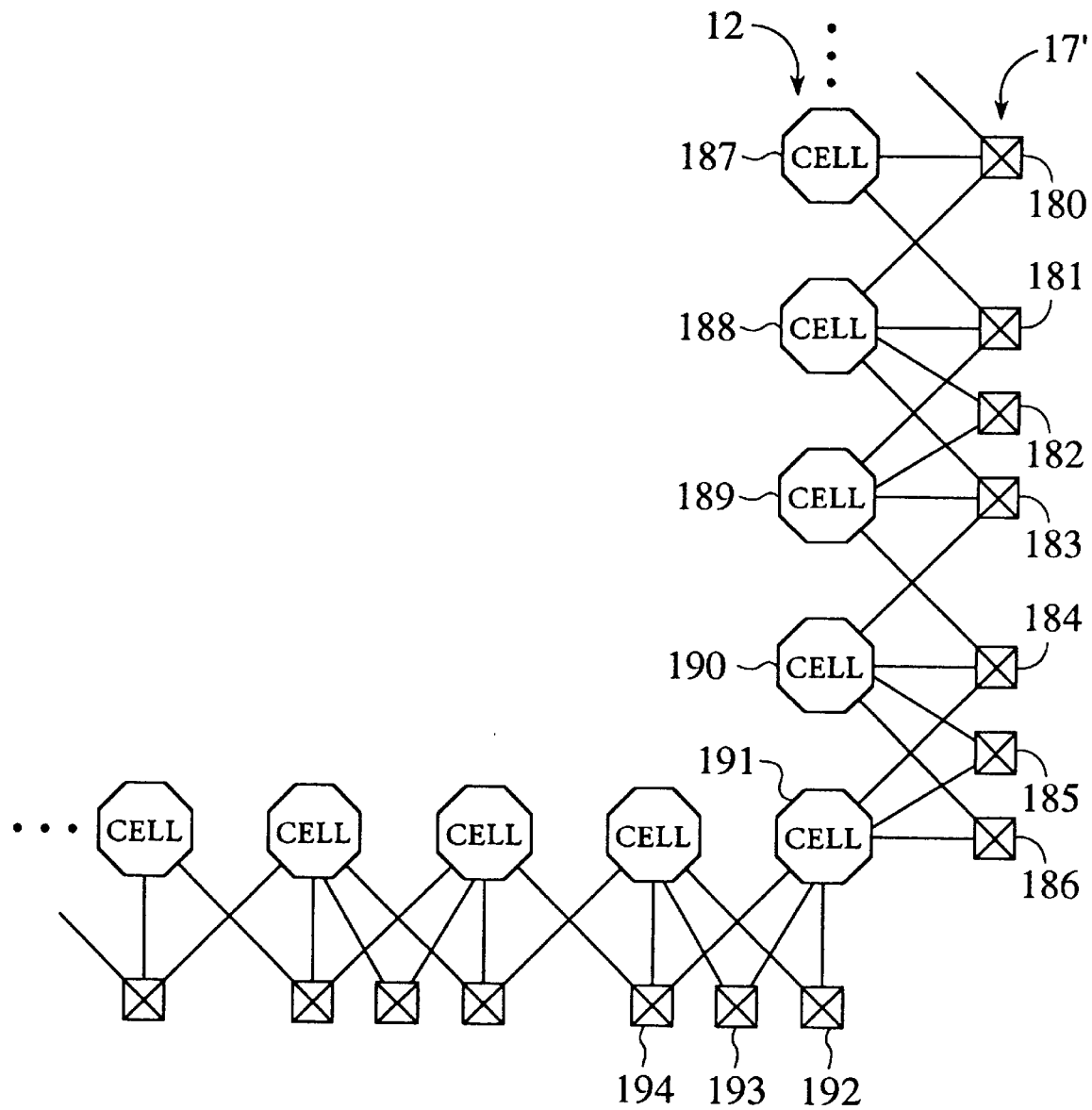
FIG. 18 is a partial schematic diagram of a set of logic cells at the perimeter of the FPGA circuit of FIG. 1, illustrating an alternative connectivity of such cells to I/O pads of the circuit from that shown in FIG. 16.
Figure 19:
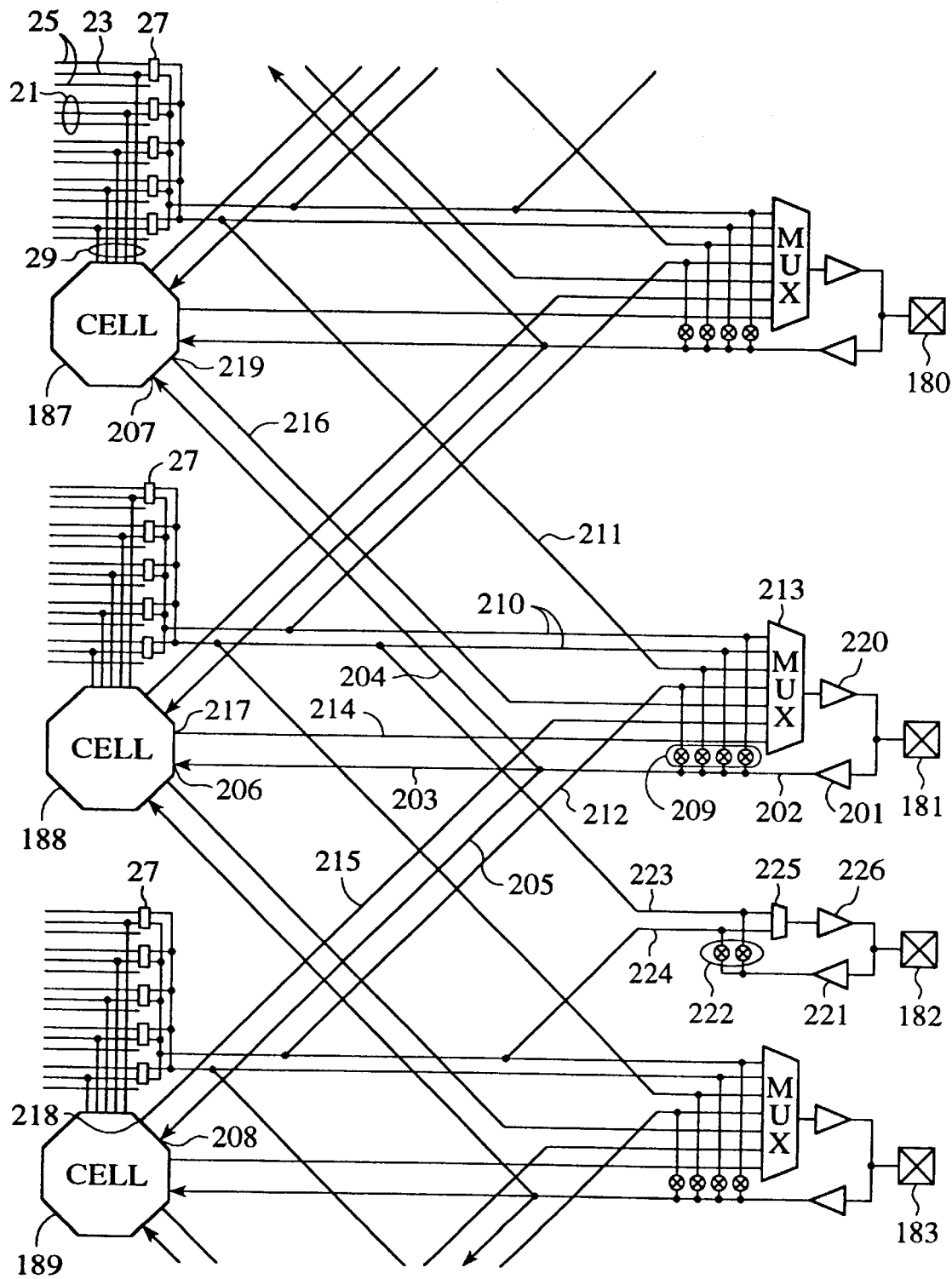
FIG. 19 is a schematic logic level circuit diagram of a cell-pad interface recording of the connectivity shown in FIG. 18.

With reference to FIGS. 18 and 19, the number of I/O pads can be increased, from one pad 17 per perimeter logic cell 11 in FIG. 16, to three pads 17' per pair of perimeter logic cells 12 shown here, or even to as many as two pads per perimeter logic cell, if desired. In FIG. 18, the I/O pads 180, 181, 183, 184, etc., directly opposite one of the non-corner perimeter logic cells 187–190 can be connected to three perimeter logic cells and to their associated bus lines as in FIG. 16. For example, I/O pad 181 is connectable to the perimeter logic cells 187–189 and associated bus lines as will be seen below with reference to FIG. 19. Additional I/O pads 182, 185, etc., not directly opposite a perimeter logic cell but positioned opposite the spaces between logic cells 188 and 189 and logic cells 190 and 191, respectively, are indirectly connectable to the two nearest perimeter logic cells through the bus lines associated with them, as will be seen in FIG. 19. Likewise, each noncorner perimeter logic cell 187–190, etc. is connectable to four I/O pads. For example, cell 188 is connectable to the I/O pads 180–183. Corner cells 191, etc. connect to six I/O pads 184–186 and 192–194, three from each line of pads.

As seen in FIG. 19, the I/O pad 181 is connected to an input buffer 201, whose output 202 splits into three input lines 203–205 leading to direct cell inputs 206–208 of the logic cells 187–189. The buffer's output 202 is also connectable, through programmable switches 209, to bidirectional signal lines 210–212 leading to repeater switch units 27 at the ends of horizontal bus lines 21 associated with each of three rows of logic cells that include the cells 187–189. Associated with the I/O pad 181 is an output multiplexer 213. This multiplexer 213 is connected to the bidirectional signal lines 210–212 from the three rows of horizontal bus lines 21 associated with the logic cells 187–189, and is also connected to cell output lines 214–216 coming from the direct cell outputs 217–219 of the logic cells 187–189. Each of these signal lines 210–212 and 217–219 connects to the inputs of the multiplexer 213, which selects at most one of them for transmission through an output buffer 220 to the I/O pad 181. I/O pads 180 and 183 directly opposite cells 187 and 189 are connected in a manner identical to I/O pad 181.

An additional I/O pad 182 is located between I/O pads 181 and 183. While I/O pads 181 and 183 are positioned directly opposite perimeter logic cells 188 and 189, pad 182 is not positioned opposite any logic cell but rather is located opposite the space between the rows associated with cells 188 and 189 and containing the horizontal bus lines 21 associated with cell 189. The I/O pad 182 is connected to an input buffer 221 whose output is connectable through programmable switches 222 to bidirectional signal lines 223 and 224. These signal lines 223 and 224 also couple through an output multiplexer 225 to an output buffer 226 connected to the I/O pad 182. The bidirectional signal lines 223 and 224 connect to the signal lines 210 leading to and from the end repeater switch units 27 for the horizontal bus lines 21 associated with cells 188 and 189.

Figure 20:
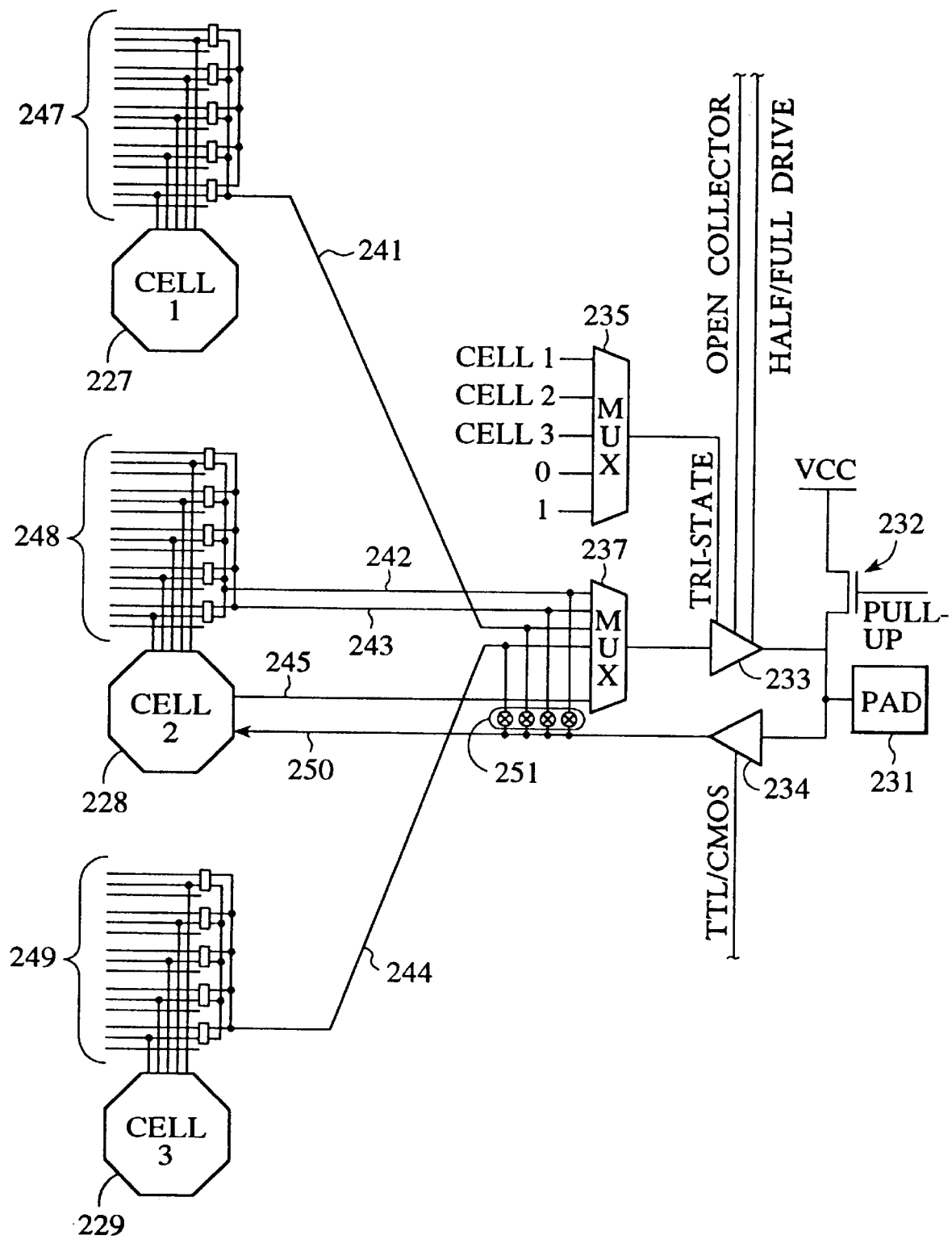
FIGS. 20 and 21 are schematic logic level circuit diagrams of cell-pad interfaces for two types of I/O pads according to a third connectivity embodiment.
Figure 21:
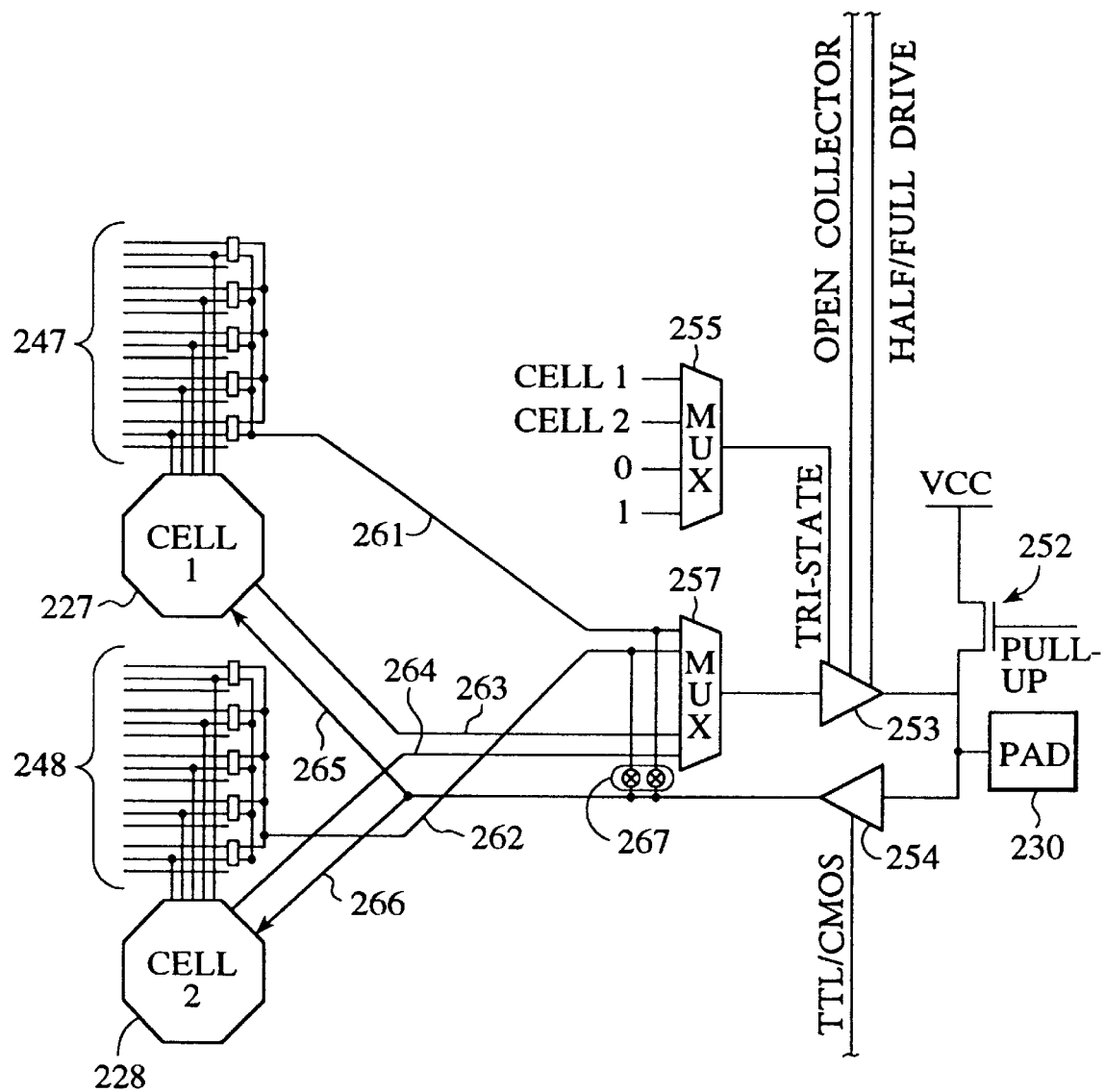

With reference to FIGS. 20 and 21, yet another embodiment of an input/output interface for FPGAs of the present invention is shown for two of the I/O pads 230 and 231. For ease in viewing the multitude of signal paths, FIG. 20 shows only the paths associated with one I/O pad 231 located immediately opposite a logic cell 228. The scheme is repeated for each cell 227, 228, 229, etc. around the perimeter of the matrix of cells in the FPGA device. Likewise, FIG. 21 shows only the paths associated with one I/O pad 230 located opposite a position between two logic cells 227 and 228. This scheme is also repeated around the perimeter of the FPGA, although usually these second I/O pads 230 are found only at every other available position between cells. Both types of I/O pads, those directly opposite logic cells and those opposite between cell positions are normally found together in an FPGA, as seen in the second I/O interface embodiment in FIG. 19.

As seen in FIGS. 20 and 21, the I/O pads 231 and 230 have pull-up transistors 232 and 252 whose gates are controlled by a user-configurable bit (PULL-UP). The primary function of these transistors 232 and 252 is to provide a logical "1" to unused pads. When on, a transistor 232 or 252 is approximately equivalent to a 10 K resistor to $V_{cc}$. Each pad 231 and 230 has an input buffer 234 and 254, respectively, connected thereto, and also has an output buffer 233 and 253, respectively, also connected thereto. The input buffers 234 and 254 have a selectable threshold level, either TTL or CMOS, which is determined by a user-configurable bit (TTL/CMOS). The output buffers 233 and 253 have selectable drive levels controlled by another user-configurable bit (HALF/FULL DRIVE). The drive levels differ in their DC current sinking capabilities. Alternatively, the buffers could have controllable slew rate, fast or slow, with the same full DC current sinking capability. Half drive or a slow slew rate, either of which reduces noise and ground bounce, is recommended for outputs that are not speed critical. An "OPEN COLLECTOR" configuration bit selectively enables or disables the active pull-up of the output buffer 233 or 253. The enable signal (TRI-STATE) for the tristate output buffers 233 and 253 are selected by multiplexers 235 and 255 from a number of options. The options typically include fixed logic levels "0" and "1" in which the buffer is either always driving or never driving, and a number of dynamic signals generated in the array. The primary I/O pads 231 directly opposite a perimeter logic cell 228 have three dynamic signal selections (CELL 1, CELL 2, CELL 3) associated with the three available output cells 227, 228 and 229, while the secondary I/O pads 230 located in a between-cell position have two dynamic signal selections (CELL 1, CELL 2) associated with its two available output cells 227 and 228. The dynamic signals may be generated within the respective cells themselves or may be provided by bus lines 247, 248 or 249 associated with those cells.

Referring now to FIG. 20 only, the I/O pad 231 connects through an output selection multiplexer 237 and the output buffer 233 to bus lines 247, 248 and 249 associated with three neighboring perimeter logic cells 227, 228 and 229 (designated CELL 1, CELL 2 and CELL 3 respectively) by way of lines 241–244. Note that two signal options are available from the bus lines 248 associated with the cell 228 immediately opposite the pad 231, while only one signal option is available from the neighboring bus lines 247 and 249. The output select multiplexer 237 also receives a direct cell output 245 from logic cell 228. The I/O pad 231 connects through input buffer 234 to a direct cell input 250 to logic cell 228 and also connects via user-configurable switches 251 to the same set of lines 241–244 leading to the bus lines 247–249.

Referring now to FIG. 21, the pad 230 located opposite the position between cells 227 and 228 connects through an output selection multiplexer 257 and output buffer 253 to bus lines 247 and 248 associated with the cells 227 and 228 by way of lines 261 and 262. The multiplexer 257 also receives direct diagonal cell outputs 263 and 264 from the cells 227 and 228. The I/O pad 230 connects through input buffer 254 to direct diagonal cell inputs 265 and 266 of cells 227 and 228 and also connects via user-configurable switches 267 to the lines 261 and 262 leading to the busses 247 and 248.

Other I/O interface configurations for the FPGA device from those shown in FIGS. 16–21 are possible.

What is claimed is:

1. A field programmable gate array (FPGA), comprising:

a matrix of rows and columns of programmable logic cells interconnectable to each other and to input and output terminals of the circuit, each logic cell including at least one register element therein with set/reset capability responsive to a set/reset control signal, and a set of control lines including one global set/reset line receiving said set/reset control signal, a plurality of column set/reset lines connected to said global set/reset line and each associated with a particular column of logic cells, and for each column set/reset line a plurality of sector set/reset lines connectable to that column set/reset line, each sector set/reset line connected to and providing said set/reset control signal to a subset of the logic cells in the associated column of logic cells.

2. The FPGA of claim 1 further comprising a means for selectively inverting said set/reset control signal provided to said subset of a column of logic cells, said means for selectively inverting being located along each sector set/reset line.

3. The FPGA of claim 1 wherein each logic cell has means for selectively designating said set/reset control signal as either a set signal or as a reset signal.

* * * * *